United States Patent
Craig et al.

(10) Patent No.: US 6,356,574 B1
(45) Date of Patent: *Mar. 12, 2002

(54) HIGH POWER, RELIABLE OPTICAL FIBER PUMPING SYSTEM WITH HIGH REDUNDANCY FOR USE IN LIGHTWAVE COMMUNICATION SYSTEM

(75) Inventors: Richard R. Craig, Victoria (CA); Robert L G. Waarts, Fremont, CA (US); David F. Welch, Menlo Park, CA (US); John G. Endriz, Belmont, CA (US); Dirk J. Kuizenga, Sunnyvale, CA (US); Steven Sanders, Palo Alto, CA (US)

(73) Assignee: SDL, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/240,361

(22) Filed: Jan. 29, 1999

Related U.S. Application Data

(62) Division of application No. 09/040,646, filed on Mar. 17, 1998, now Pat. No. 6,167,075, which is a continuation of application No. 08/677,146, filed on Jul. 9, 1996, now Pat. No. 5,761,234.

(51) Int. Cl.$^7$ .............................................. H01S 3/0933
(52) U.S. Cl. .......................................... 372/75; 372/50
(58) Field of Search ...................................... 372/75, 50

(56) References Cited

U.S. PATENT DOCUMENTS

| | | | |
|---|---|---|---|
| 4,649,351 A | 3/1987 | Veldkamp et al. ............ 330/4.3 |
| 4,962,995 A | 10/1990 | Andrews et al. ................ 372/6 |
| 4,978,974 A | 12/1990 | Etzel ........................... 346/107 |
| RE33,722 E | 10/1991 | Scifres et al. .................. 385/33 |
| 5,117,303 A | 5/1992 | Desurvire et al. .......... 359/341 |
| 5,138,621 A | 8/1992 | Goto et al. .................... 372/75 |
| 5,140,598 A | 8/1992 | Tagawa et al. ................. 372/6 |
| 5,185,758 A | 2/1993 | Fan et al. ...................... 372/72 |
| 5,187,610 A | 2/1993 | Habbab et al. ............. 359/341 |
| 5,202,893 A | 4/1993 | Kubota et al. ................. 372/34 |
| 5,247,529 A | 9/1993 | Heidemann ................... 372/23 |
| 5,263,036 A | 11/1993 | De Bernardi et al. ........... 372/6 |
| 5,287,216 A | 2/1994 | Chirravuri et al. .......... 359/341 |
| 5,337,325 A | 8/1994 | Hwang ........................ 372/75 |
| 5,351,259 A | 9/1994 | Ishimori et al. .............. 372/75 |
| 5,369,659 A | 11/1994 | Furumoto et al. ............. 372/50 |
| 5,369,661 A | 11/1994 | Yamaguchi et al. ........... 372/6 |
| 5,406,411 A | 4/1995 | Button et al. ................ 359/341 |
| 5,422,754 A | 6/1995 | Naito ......................... 359/341 |
| 5,430,572 A | 7/1995 | DiGiovanni et al. ........ 359/341 |
| 5,761,234 A * | 6/1998 | Craig et al. .................... 372/75 |

OTHER PUBLICATIONS

C.R. Giles et al. "Simutaneous Wavelength–Stabilization of 98 nm Pump Lasers", Jul. 4–6, 1993.
Optical Amplifiers and their Applications, Yokohama, Japan.

* cited by examiner

*Primary Examiner*—James W. Davie
(74) *Attorney, Agent, or Firm*—Allen, Dyer, Doppelt, Milbrath & Gilchrist, P.A.

(57) ABSTRACT

A multistage optical amplifier pumping system with built-in redundant reliability for lightwave communication system provides plural levels of redundancy. A first level of redundancy deals with redundancy in the form of plural primary laser diode sources for pumping a single fiber laser pump source. A second level of redundancy deals with redundancy of a plurality of fiber laser pump sources for pumping a plurality of serially connected injection signal fiber amplifiers forming the multistage amplifier system. If one of fiber pump sources should fail, increased pumping power is available from the remaining fiber pump sources via their respectively connected amplifier stages. A third level of redundancy deals with redundancy in the employment of multiple single mode laser emitters on the same chip or bar sufficiently segmented and/or electrical isolated so as not to interfere with operation of or cause failure to adjacent or neighboring emitters on the same chip or bar.

35 Claims, 8 Drawing Sheets

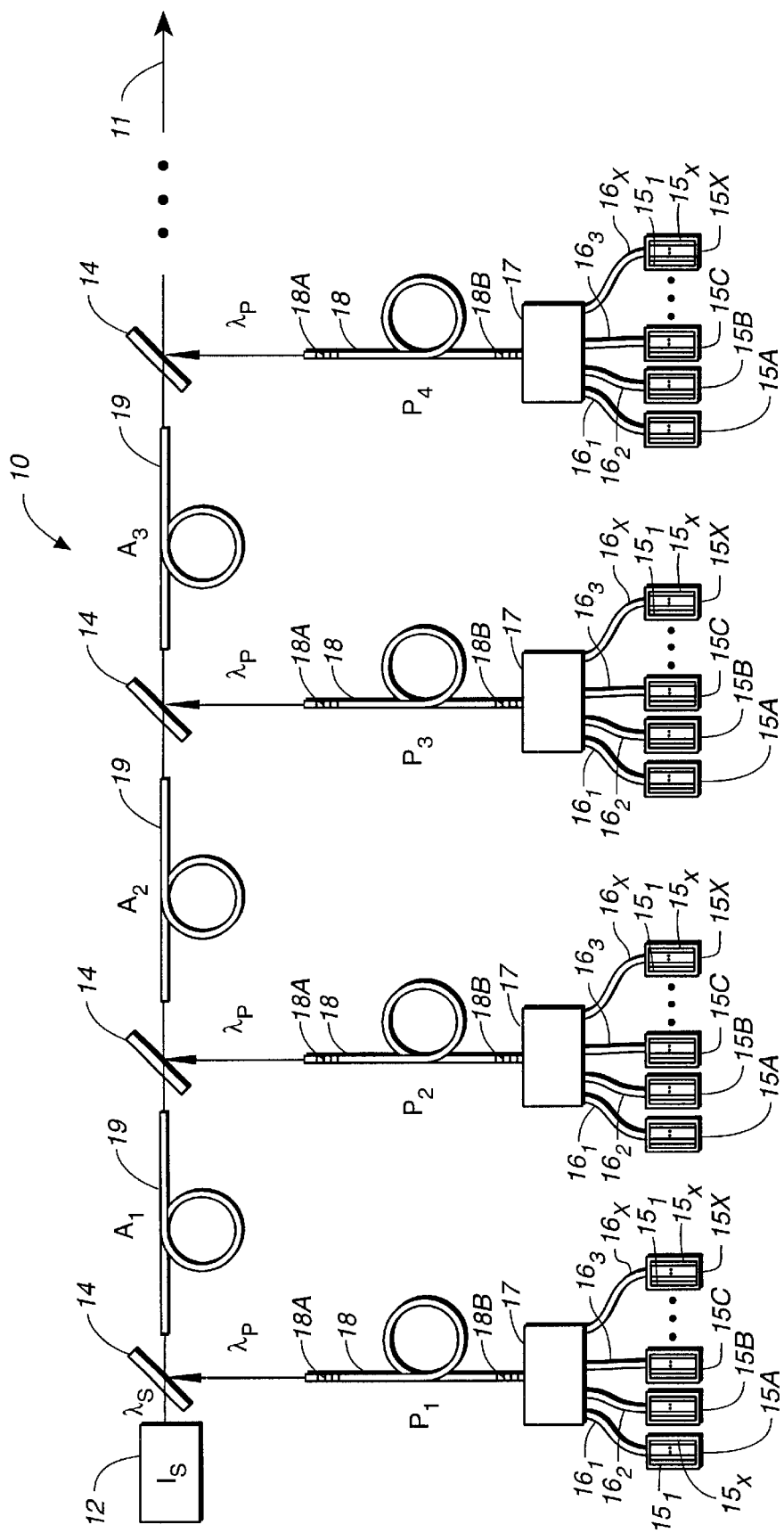
FIG._1

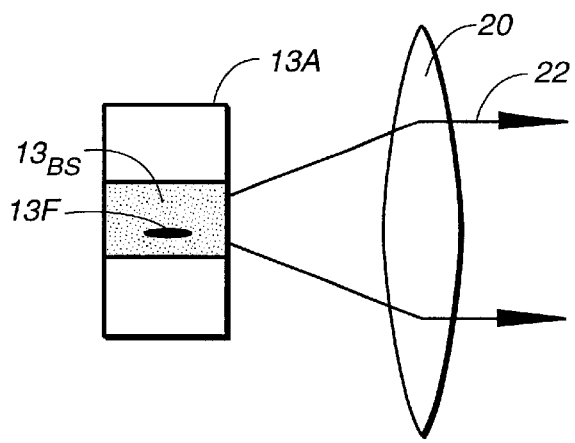
FIG._2
*(PRIOR ART)*
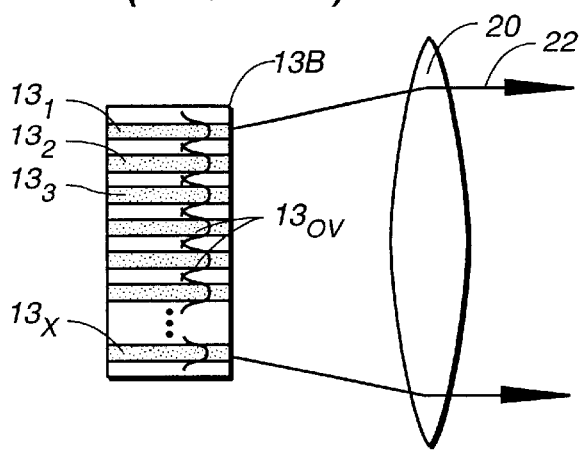
FIG._3
*(PRIOR ART)*
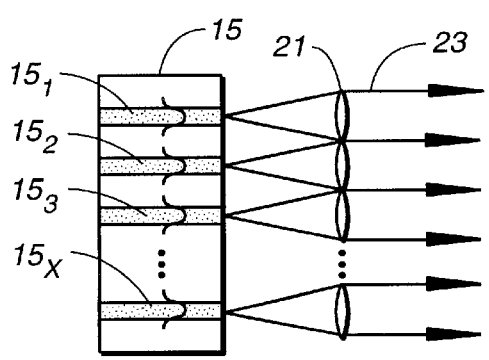
FIG._4

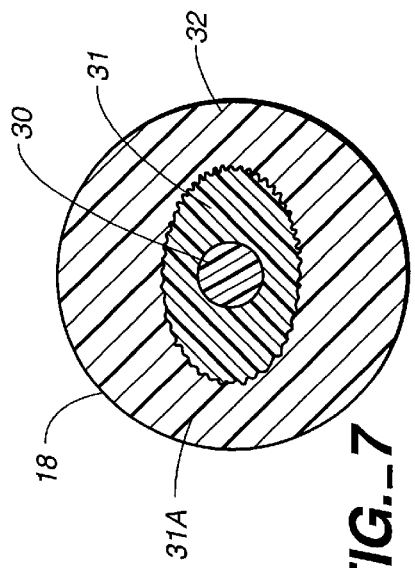
FIG._7
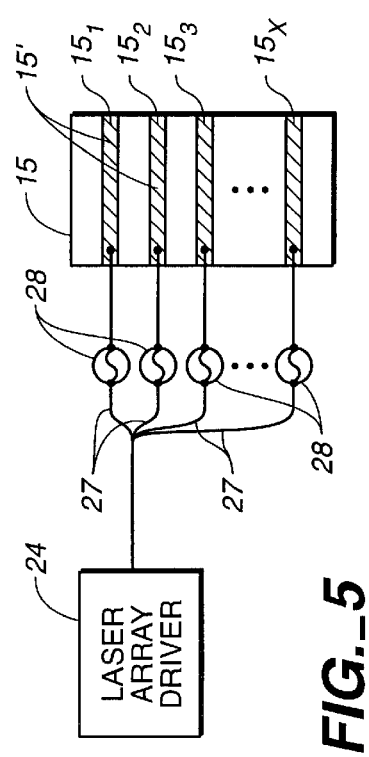
FIG._5
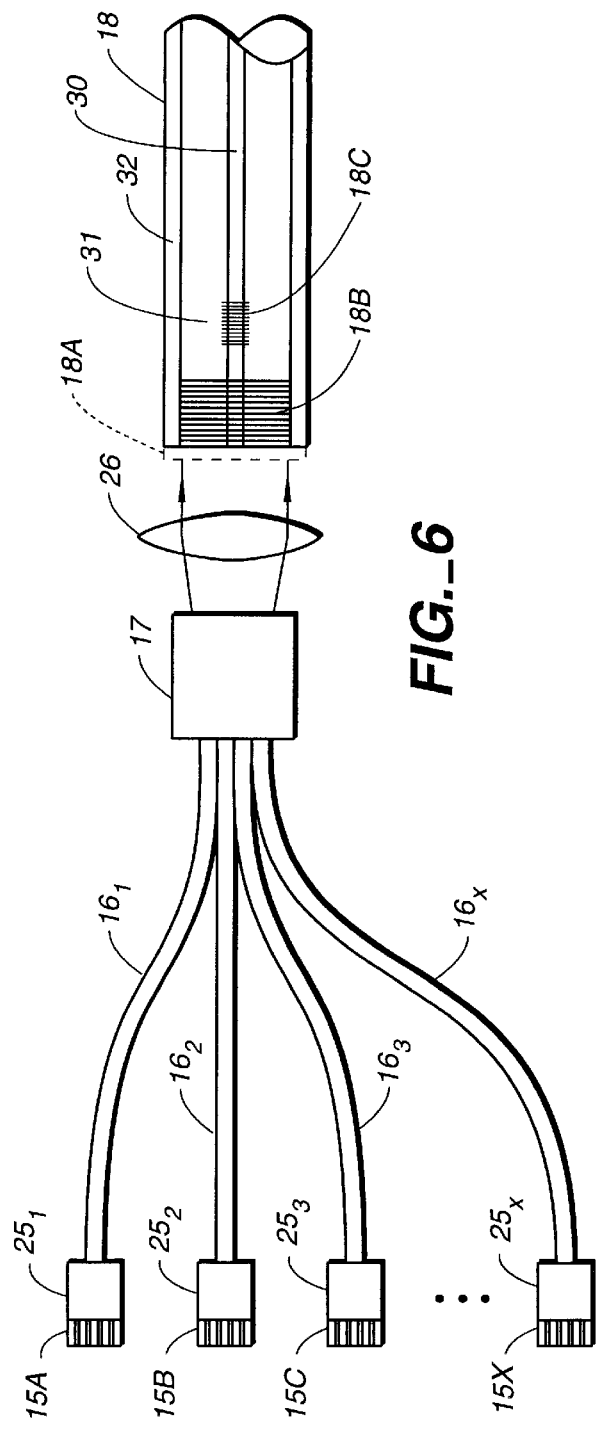
FIG._6

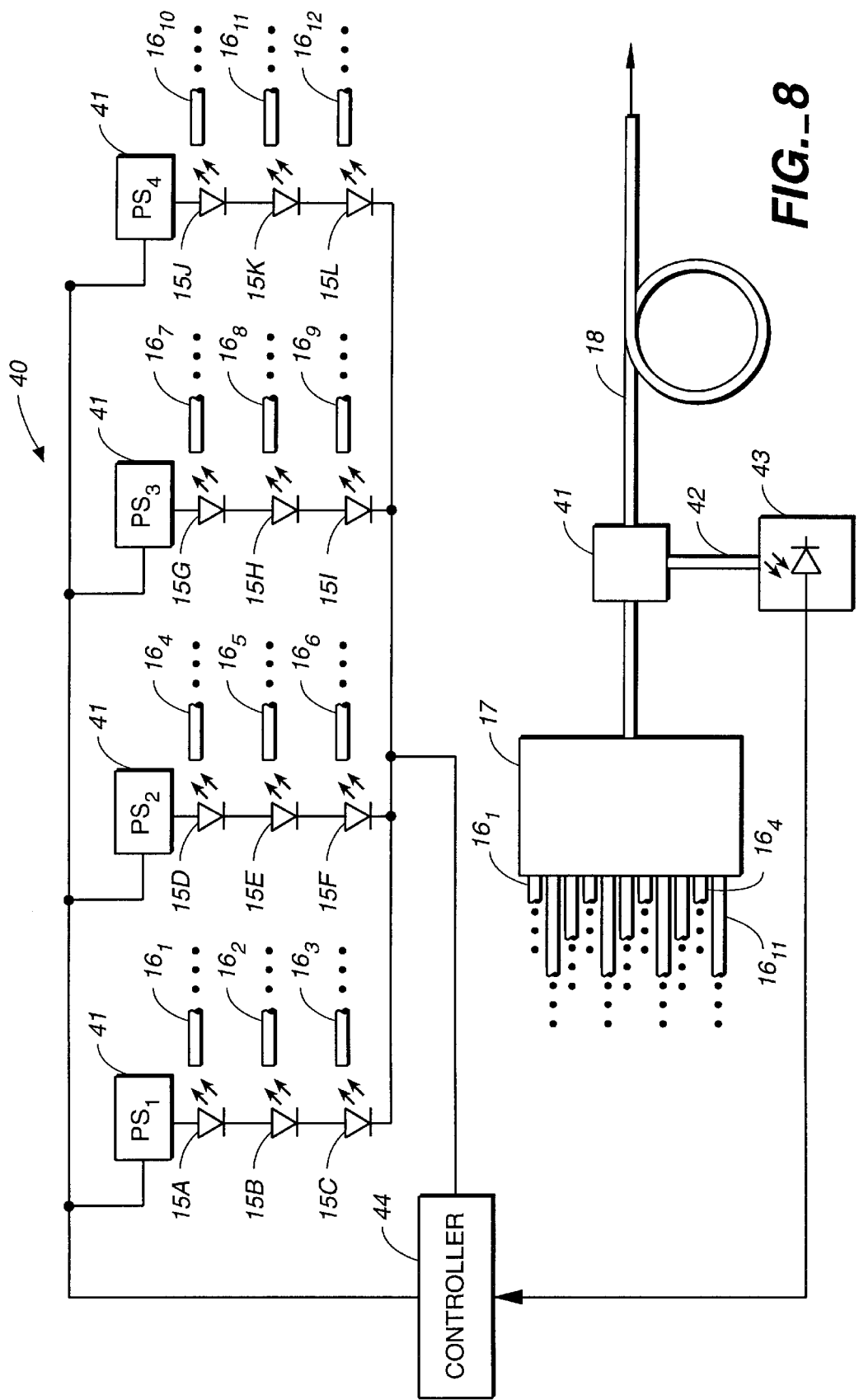

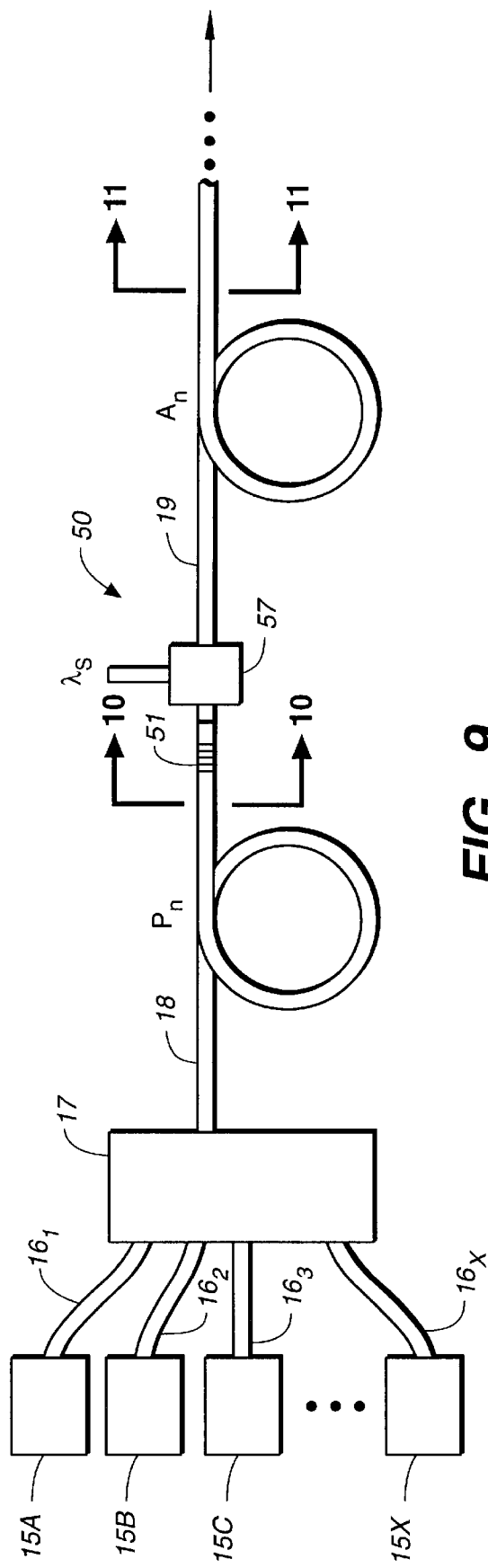
FIG._9
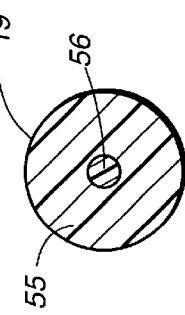
FIG._10
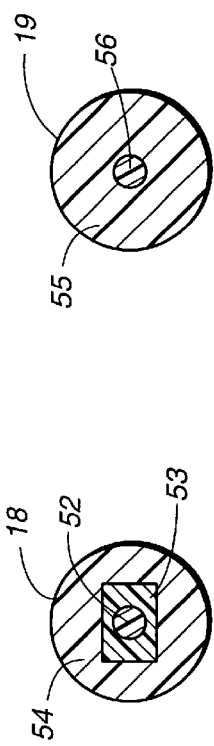
FIG._11

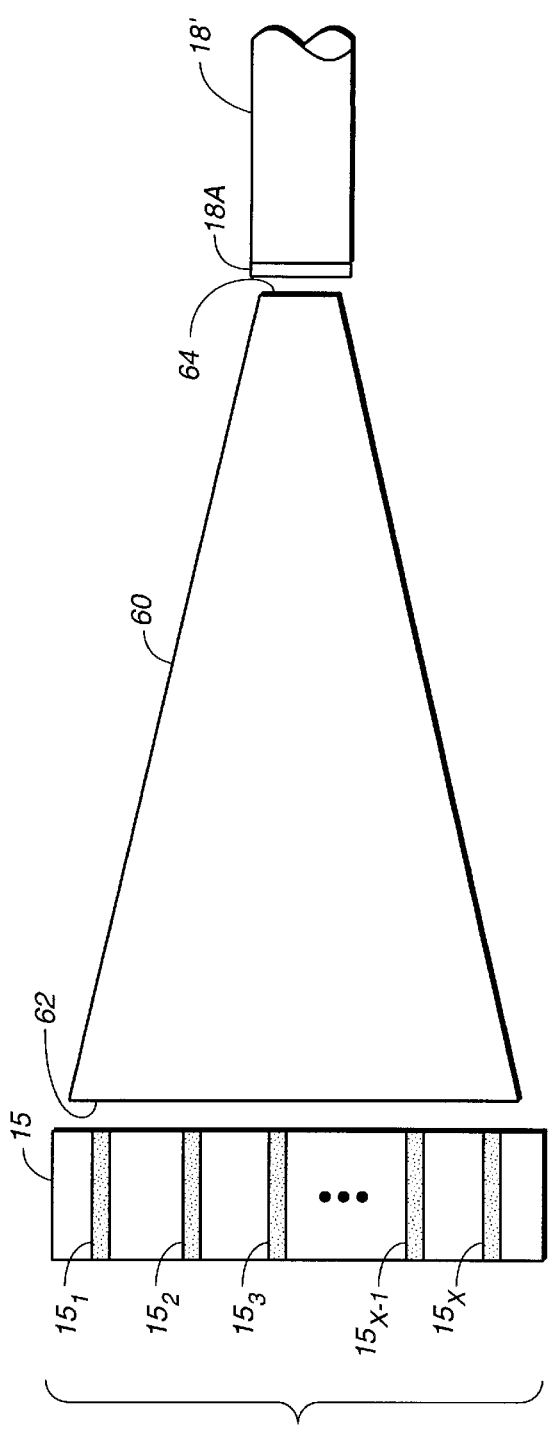
FIG._12
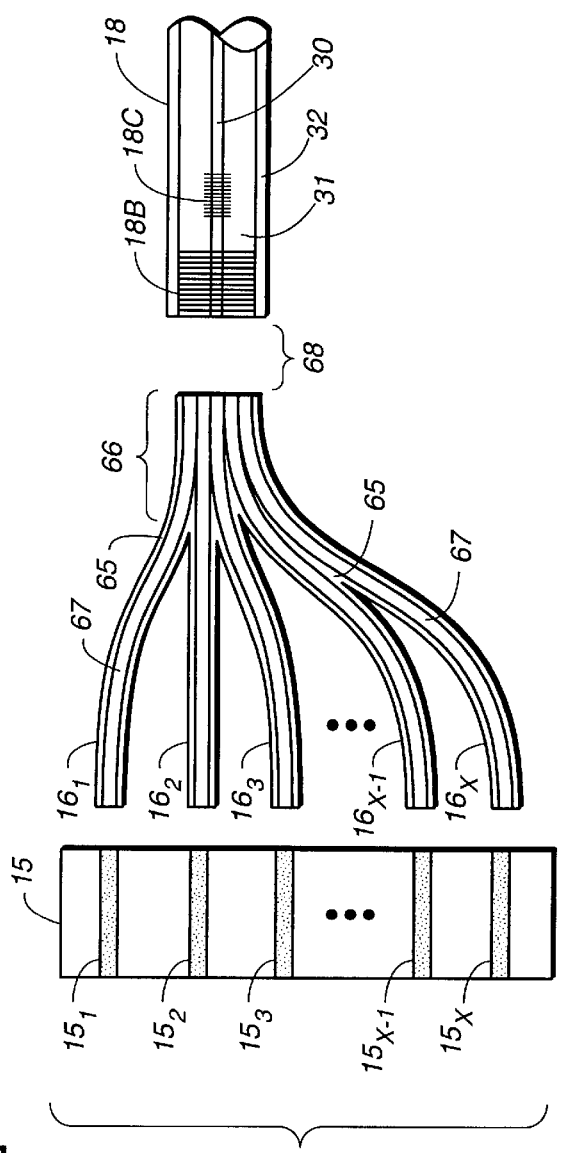
FIG._13

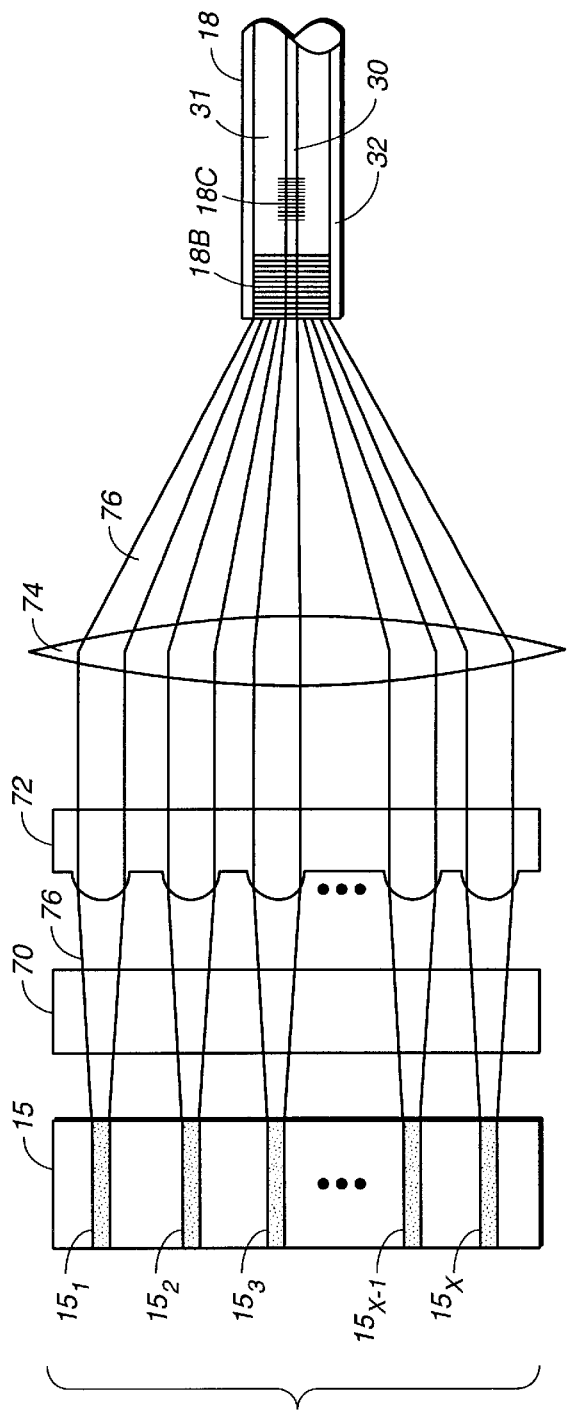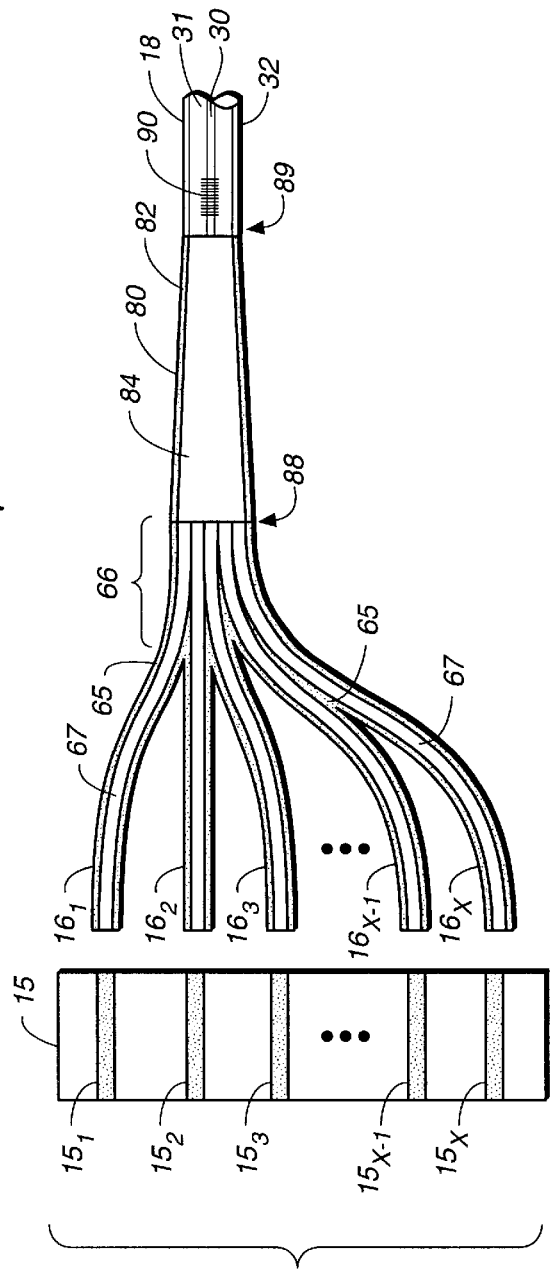

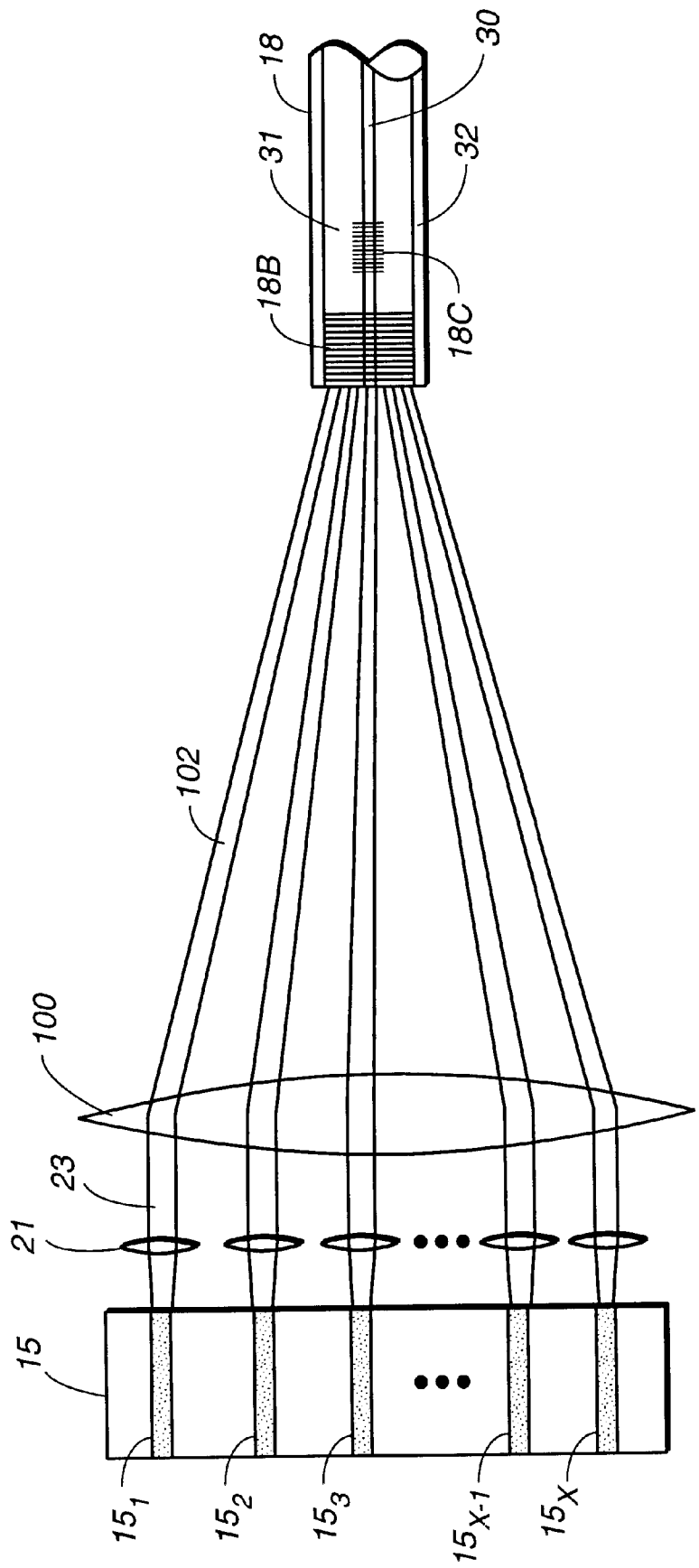
FIG._16

HIGH POWER, RELIABLE OPTICAL FIBER PUMPING SYSTEM WITH HIGH REDUNDANCY FOR USE IN LIGHTWAVE COMMUNICATION SYSTEM

CROSS REFERENCE TO RELATED APPLICATION

This application is a divisional application of application Ser. No. 09/040,646, filed Mar. 17, 1998, U.S. Pat. No. 6,167,075, which is a continuation of application Ser. No. 08/677,146, filed Jul. 9, 1996, now U.S. Pat. No. 5,761,234.

FIELD OF THE INVENTION

This invention relates generally to high power optical transmission gain mediums used in lightwave communication systems and more particularly to high reliability pumping architectures for fiber amplifiers and fiber lasers used in optical signal amplification in lightwave communication systems.

BACKGROUND OF THE INVENTION

Rare-earth doped fiber amplifiers have come into prominent use in lightwave communication systems, such as for use in optical long haul terrestrial and undersea communications, distributed local area networks and in satellite communication systems, such as communication service between communication satellites in space orbit around the earth. In these systems, a major utility of the rare-earth doped fiber gain medium, such as a fiber laser or fiber amplifier, e.g., erbium-doped fiber amplifiers (EDFAs), is power boosting such as for optical transmitters, receivers or repeaters to periodically boost the transmitted signal to levels sufficient for its reliable transmission along the entire lightwave communication system. In many of these applications, the optical fiber amplifier is physically remote from the point of initial transmission or from the point of final delivery destination so that a highly reliable communication system between the point of communicative origin and final delivery destination is necessary and required due to lack of ability to easily replace or otherwise correct faulty operating components in remote regions of the system, such as, for example, in the case of remotely located optical repeaters or high power optical transmitters in outer space satellites. One such component is the radiation laser sources used to pump the fiber amplifier. Such high power sources have recently become more available in the form of semiconductor pump lasers which are sufficiently reliable to enable the increasing use of rare-earth doped fiber amplifiers.

It is conventional practice to employ 980 nm or 1480 nm semiconductor laser diodes to pump a fiber gain medium to produce amplified optical signals in the range of about 1530 nm to about 1560 nm. Most commonly a multiple QW semiconducter laser diode operating at 980 nm is used because of its low noise figure and good conversion efficiency. The pump laser wavelength of 980 nm falls within the erbium absorption band of the amplifier. In order to enhance the reliability of the semiconductor laser diode pumped fiber gain medium, the outputs of several laser diodes may be optically coupled to a fiber multimode gain medium as illustrated in U.S. Pat. No. 5,263,036, showing a double clad fiber. Thus, if one laser diode malfunctions or becomes inoperative, the remaining laser diodes can continue to function in the pumping task. Also, the use of multiple lasers permits a decrease in the power requirements of the individual laser diode, increasing reliability without compromising the gain of the amplifier as taught in U.S. Pat. No. 5,287,216. The problem arises, however, that when one, and particularly in the case of more, laser diodes fail, an increase in total power required from the remaining laser diodes is inevitable to prevent any compromise of amplifier gain or output power. One manner of solving this problem is to employ a laser array or laser bar so that multiple emitter outputs are provided from a single monolithic laser source. While such an array can provide high pumping power, if one or more laser emitters in the array malfunction or become inoperative, emitter failure affects the quality of the output of the other emitters in the array since the emitters are closely spaced to provide a single full beam output. Such laser arrays can be replaced by broad area emitter laser diodes where several such broad area lasers together can be employed to achieve high power output for the pumping application. However, such broad area lasers have not proved to be reliable over sufficiently long periods of time, particularly since they are subject to filamentation resulting failure, operate at high temperatures and have a tendency to have larger noise figures. Also, broad area lasers need adequate cooling, such as with thermoelectric coolers, adding to the required system components and adding additional concerns for long term system reliability.

The semiconductor laser diode, used as a pumping source for an optical fiber gain medium which is used itself as a pumping source, is considered the least reliable link in an optical fiber pumping system used in a lightwave communication system because these laser devices have a comparatively shorter lifetime. Fiber amplifiers have greater long term reliability compared to semiconductor laser diodes and their lifetime behavior is determinative of the overall lifetime of the lightwave communication system particularly if the system components are in a location not suited for immediate and efficient replacement, such as in the case of outer space.

What is required for enhancing the lifetime capabilities of lightwave communication systems is to increase the long term reliability of the least reliable link, i.e., improve the long term effectiveness of the entire communication system by improving the semiconductor pumping source effectiveness, reliability and longevity in these systems.

Therefore, it is a primary object of this invention to improve the long term reliability of lightwave communication systems.

It is further object of this invention to improve the long term reliability of lightwave communication systems by providing one or more levels of built-in redundancy in the pump sources for the amplifiers employed in lightwave communication systems.

It is still another object of this invention to provide plural levels of redundancy in a high power pump source for solid state optical gain medium, optical fibers being one such medium, to extend the lifetime operation of a lightwave communication while providing longer term maintenance-free operation.

SUMMARY OF THE INVENTION

According to this invention, a high power optical amplifier pumping architecture with built-in redundant reliability for a lightwave communication system comprises plural levels of redundancy in the pump source for solid state gain media employed in the system so that the lifetime operation of the entire communication system is significantly increased. This architecture has particular application in communication systems that are placed in remote locations subject to environmental hardships and lack of ease to repair or replace, such as in remote terrestrial and undersea communication locations or outer space satellite locations. The redundant lightwave communication system of this invention comprises a pump source that includes a plurality of semiconductor segmented laser arrays for pumping a single double clad rare-earth doped fiber providing a high power fiber pump source. In turn, a plurality of such high power pump sources are utilized for respectively pumping a plurality of concatenated optical fiber amplifiers wherein the fiber amplifiers are optically coupled as stages to amplify an injection signal provided as input to the first of such fiber amplifier stages.

A first level of redundancy of this invention deals with redundancy of the laser pumping sources for the lightwave communication system. The pumping source comprises a plurality of segmented laser arrays, each array having plural emitters, channels or groups of the laser segments, employed for pumping a single double clad fiber pump source. A sufficient number of segmented laser arrays are provided as primary semiconductor pump sources for a single double clad fiber pump source so that their total operation can be accomplished below the standard rated output levels of the individual arrays, i.e., a plurality of segmented laser arrays for pumping one of a plurality of fiber pump sources are operated below power rated output. Since the segmented laser arrays are operated below their rated power output, an increase in the power output of the remaining segments can be accomplished to meet the demands of the pumping application at its rated power requirements. If the failure is of sufficient magnitude to render ineffective an entire segmented laser array, the remaining segmented laser arrays are operated at their near rated power output to continue the pumping application at its rated power requirements. In other words, if one or more of the segmented laser arrays fails, then the total power output of the remaining segmented laser arrays may be individually increased to compensate for the power loss due to the failed segmented laser array without exceeding the rated power level of any respective segmented laser array. The subsequent achievement of stable operation at full operating power required for the particular pumping application is indicative that the failure is of limited nature and the pumping can be continued at the rated power require for the fiber pump source. Thus, the life expectancy of the operation of the fiber pump source is substantially extended. Moreover, the failure of a single segmented laser array is a precursor of potential system failure and can be employed as an effective warning that immediate system maintenance is eminent.

An additional aspect of this first level of redundancy deals with redundancy in the form of plural power supplies for multiple laser sources in the lightwave communication system. A plurality of laser sources are provided for pumping a fiber pumping source employing a plurality of power supplies. The arrangement may be such that a plurality of laser pump sources can be driven in series by one of the plurality of pumping supplies so that if any one or more power supplies fails, then the remaining power supplies can provide additional electrical pumping power to accommodate the pumping application at its rated power requirements. Moreover, if anyone of the series connected laser pump sources fails, the connected power supply output power signal can be increased to increase the power output of the remaining serially connected laser pump sources. In the extreme, a separate power supply can be provided to separately drive each laser pump source.

A second level of redundancy deals with redundancy of a plurality of fiber laser pump sources for pumping a plurality of serially connected injection signal fiber amplifiers forming the multistage amplifier system. If one of fiber pump sources should fail, increased pumping power is available from the remaining fiber pump sources via their respectively connected amplifier stages.

A third level of redundancy of this invention deals with plural single mode emitters or channels in segmented laser arrays. A reduction in failure rate due to optical degradation of individual laser diode emitters in such arrays is achieved by using multiple narrow stripe emitters in place of single broad area laser diode emitters having substantially no optical overlap with one another. If the individual emitters or channels are sufficiently separated from one another in each segmented laser array, the possibility of lateral dark line defect propagation across the segmented laser array is substantially reduced, and catastrophic failure of adjacent emitters due to lateral propagation of dark line defects or the result of facet damage, in the form of propagating facet blisters into regions of adjacent emitters, of one or more laser emitters in the segmented laser array will not affect the continued operation of other laser emitters in the same array.

Failure rate of adjacent emitters is increased where dark line defects formed in one emitter which fails propagate laterally into one or more adjacent emitters of the array. The propagation of dark line defects is caused by either or the combination of generated light in the form of photons produced in the active regions of adjacent emitters and the pumping current applied to the emitters. If the light created in the respective emitters does not extend or overlap into adjacent emitters, then lateral dark line propagation will not occur. If the current through a failed emitter continues due to an electrical short, dark line defect lateral propagation can continue into adjacent emitters. If the individual emitters on a segmented array are individually addressable, each with appropriate in-line fusing, then an increase in current through the shorted, failed emitter (which is the most common result of emitter failure) will bring about failure of an in-line fuse and terminate further current flow through the failed emitter.

An additional aspect of this second level of redundancy deals with the individual emitters of the segmented laser arrays being operated below their rated power output so that the reliability of the pumping system is enhanced by other adjacent emitters on the same segmented laser array chip taking on the additional power requirements for pumping the fiber pumping source at required operating level when any one or more segmented laser array emitters fail to operate. Thus, an important aspect of this invention is that the array reliability can be evaluated as though the total required power delivery of the plurality of separate and independent segmented laser arrays are individually independent plural single mode laser sources.

The concept of multiple single laser sources for pumping a single amplifier source is known in the art as exemplified in U.S. Pat. Nos. 5,185,758; 5,202,893 and 5,263,036. However, these applications, in principal, involve the use of a plurality of single sources or arrays for pumping an optical amplifier device, such as a fiber amplifier or laser rod, for the purpose of achieving high pumping powers with no treatment provided for long term utility and life expectancy. Also, the concept of multiple laser array sources in the form of segments such as plural laser bar sources coupled into a single lens system is known in the art. Examples of single and multiple semiconductor laser array sources are shown in U.S. Pat. Nos. 4,716,568; 4,803,691; 5,193,098 and 5,384,797, assigned to the assignee herein. However, the consideration and treatment of the operation of these laser bar sources for the purpose of enhancing long term operation while maintaining required power levels of operation has not been considered before in depth relative to applications that are not easily adapted to repair or replacement and considerations of long term usage and lifetime.

It is known in the past that optical isolation can be achieved by segmenting the laser source into many individual separate emitters or channels, albeit single mode or multimode. Past experience has been that, in order to achieve single mode operation of the separate emitters, a center-to-center spacing in the case of nonplanar type active region structures had a spacing anywhere between about 5 $\mu$m to 20 $\mu$m, and in the case of planar type active regions structures, it was thought that the center-to-center spacing of 10 $\mu$m was believed sufficient. However, this has been found out that planar type active regions with such center-to-center spacing may not to be sufficient since multimodes are present because some small fraction of optical overlap is still present, although still proper for some applications, such as in the case of xerographic photoreceptor imaging employing a monolithic array of individually addressable laser emitters. Thus, this concept of separation is good for some applications but is not sufficient for others where strict single mode operation is required with the multiple emitters providing the same wavelength of operation acceptable for the absorption band peak of the active element employed in the fiber pumping source. We have discovered that the channel or emitter separation for planar type active region structures must be greater than a 10 $\mu$m center-to-center with its output still capable of being optically coupled to a multimode fiber, such as a double clad fiber; otherwise, there is sufficient optical overlap into adjacent channels that will directly effect the character of their operation. By sufficient optical overlap, we mean that the evanescent field of the propagating radiation in one channel extends into the adjacent channel by even less than 1%, affecting the operation of the entire segment. Therefore, the type of separation desired in a redundant lightwave communication system of this invention is zero optical field overlap and this cannot be accomplished unless the center-to-center separation of the segment channels is at least 13 $\mu$m. Thus, the optimal range of center-to-center separation between channels in planar type active region structures is about 13 $\mu$m to about 15 $\mu$m. Insured zero percent isolation between channels may also be achieved with the provision of grooves between the channels which will also prevent lateral dark line propagation between emitters or channels.

With greater separation among individual channels in a laser segment to achieve substantially zero optical field overlap among the channels, the optics employed as well as the coupling between the segmented laser arrays and the input into the fiber pump sources must provide optimum filing. With comparatively larger separation of array emitters, full brightness from segmented laser arrays must be assured. This is accomplished by beam filling optics comprising, for example, a microlens for each emitter. Moreover, efficient focusing of the resulting bright beams from the microlens array can be accomplished by employing a turning mirror array which provides for common size divergence or beam symmetry in both orthogonal beam dimensions.

In connection with this invention, therefore, a plurality of high power, fiber pump sources are utilized each respectively for pumping one of a plurality of concatenated fiber amplifiers. In order to enhance the power of a transmitted signal, such as in the case of a 1.55 $\mu$m optical communication transmitter, a system is comprised of a series of optically coupled single mode fiber amplifiers each pumped by a high power double clad fiber laser pumping source having an output wavelength matching the wavelength absorption band of its respective single fiber amplifier. The plural fiber laser pump sources are each pumped by a plurality of segmented laser arrays with either nonplanar type active region structures such as, buried heterostructures, channeled substrate nonplanar active region waveguide structures, or mesa waveguide structures; or planar type active regions structures, such as a channeled substrate planar active region waveguide structures, ridge waveguide structures or an impurity induced disordered waveguide structures with proper interspatial emitter or channel segmentation, both of which provide for redundancy resulting in optimum reliability and power efficiency. If one of the fiber laser pump sources should fail, the system can still continue to operate with the remaining fiber laser pump sources unaffected by adjacent emitter failure, and together providing the required output to meet the gain requirements of the fiber laser or amplifier.

These and other features of the invention are expressed in further detail in the description and discussion of the redundant pumping scheme and its application to a lightwave communication system as illustrated in the accompanying drawings.

BRIEF DESCRIPTION OF THE DRAWINGS

FIG. 1 is a schematic illustration of a first embodiment of this invention for providing multiple levels of redundancy in a lightwave communication system.

FIG. 2 is a schematic illustration of a broad area laser employed in the past as a primary pumping source for fiber pump sources.

FIG. 3 is a schematic illustration of a multiple emitter laser array employed in the past as a semiconductor pumping source for fiber pump sources.

FIG. 4 is a schematic illustration of optical field isolation utilized in this invention comprising a multiple segmented emitters in a laser array employed as a semiconductor pumping source for pumping a fiber pump source in the system shown in FIG. 1.

FIG. 5 is a schematic illustration of electrical field isolation utilized in this invention comprising the fusing of electrical supply leads to individually contacted emitters of the laser array.

FIG. 6 is a schematic illustration of detailed coupling of a plurality of segmented laser arrays to a double clad fiber laser pump source.

FIG. 7 is a cross-sectional view of an example of a double clad fiber that may be employed as the fiber laser pump source shown in FIG. 6.

FIG. 8 is a schematic illustration of a plurality of segmented semiconductor laser sources which are fiber coupled to form a primary pump source for a double clad fiber laser pump source with means to maintain the output power level of the semiconductor pump sources.

FIG. 9 is a schematic illustration of a second embodiment of this invention for providing multiple levels of redundancy in the lightwave communication system.

FIG. 10 is a cross-sectional view taken along the line 10—10 of FIG. 8 illustrating another example of a double clad fiber for use as a fiber laser pump source in conjunction with either the first and second embodiments shown in FIGS. 1 and 9.

FIG. 11 is a cross-sectional view taken along the line 11—11 of FIG. 9 illustrating an example of a single core fiber for use as a fiber amplifier in conjunction with either the first and second embodiments of FIGS. 1 and 9.

FIG. 12 is a schematic view of an optical funnel for accepting the plural emitter output from segmented semiconductor laser array for diverging input into a single fiber pump source.

FIG. 13 is a schematic view of a configuration for enhancing the optical coupling of a segmented laser array to a double clad fiber employing a fused fiber bundle.

FIG. 14 is a schematic view of a configuration for enhancing the optical coupling of a segmented laser array to a double clad fiber employing orthogonal collimating lens system.

FIG. 15 is schematic view of a configuration for enhancing the optical coupling of a segmented laser array to a double clad fiber employing an optical taper.

FIG. 16 is a schematic view of a configuration for achieving wavelength stabilization of a segmented laser array according to this invention employing a fiber grating in a multimode core fiber.

PREFERRED EMBODIMENTS OF THE INVENTION

Reference is now made to FIG. 1 illustrating a first embodiment of this invention. High power optical amplifier pumping system 10 comprises a high speed, low power injection signal source 12, for example, 1.55 $\mu$m or 1.06 $\mu$m injection signal, $I_s$, having a wavelength, $\lambda_s$, to be amplified. The injection signal, $I_s$, is amplified by a series of optically coupled stages comprising single mode fiber amplifiers 19, i.e., amplifiers A1, A2, A3, etc. Each amplifier 19 has a rare-earth doped core, such as, for example, Er, Nb, Yb or co-doped with Er:Yb. The use of co-doped cores in amplifiers 19 significantly increases the range of pump wavelengths available for pumping these amplifiers, which is discussed in further detail later. Also, each of the signal amplifiers 19 is pumped by a high power, rare-earth doped, double clad fiber gain source 18, such as diode-pumped solid-state (DPSS) lasers or fiber lasers doped with Nd, to provide an output wavelength, $\lambda_p$, of 1.06 $\mu$m, which is matched to the wavelength band for pump absorption in Er:Yb core-doped single mode amplifiers 19. Fiber pumping sources 18 are preferably operated as fiber lasers but may be fiber amplifiers tuned to multiple wavelengths within the absorption wavelength band of the doped fiber amplifiers, particularly in connection with applications requiring low noise operation. The double clad fibers used for fiber pump sources 18 may have a double clad fiber design such as shown in FIG. 7 or FIG. 10. The high pump output power from fiber pump sources 18 is provided as pump input to a respective fiber amplifier 19 by means of a beam combiner such as, for example, by means of splicing the double clad fiber source 18 to the single mode fiber of amplifier 19 or by means of dichoric beam combiners 14 as illustrated in FIG. 1. The beam combiner permits coupling together of both the signal and pump wavelengths within the gain and absorption bands, respectively, of fiber amplifier 19.

In order to achieve high pump power output from amplifiers 18 as well as enhance their long term reliability, a plurality of segmented laser arrays 15A–15X are utilized as primary sources for each fiber pump source 18 via beam combiner 17, i.e., the wavelengths from the individual emitters or channels $15_x$ of arrays 15 are substantially the same and if slightly different are still within the absorption band of fiber amplifier 18. Segmented laser arrays may be of the non-planar active region type. Of particular interest here, however, is the planar active region type because of their more ease in manufacture because they do not require additional processing, such etching and regrowth, and their more reproducible operating characteristics from array to array. Thus, if there are variations in wavelength of emitters 15 due to changes in laser operating temperatures, the emitters emission wavelengths will still fall within the absorption band of fiber amplifier 18. Such broader absorption bands may be achieved through two or more combinations of rare earth species doped into the fiber core, such as Er:Yb. The larger absorption bands of amplifiers 18 eliminates the need for TEC coolers to control the temperature of the respective segmented laser arrays 15. In order to increase the power from semiconductor pump sources 15 to provide a high power output of fiber pump source 18, a large number of laser diode segmented arrays are utilized. The beams from segmented array sources 15 are collimated or otherwise collected and focused into the inner cladding of fiber pumping sources 18 to enable efficient and achieve high pumping powers for pumping amplifiers 19. As shown in FIG. 1, the particular optical coupling of segmented laser arrays 15A, 15B, 15C, . . . to beam combiner 17 is via a plurality of fibers $16_1$, $16_2$, $16_3$, etc. Fibers 16 may be a single or multimode fiber for coupling all the respective output beams from a single segmented laser array 15 or may be groups of fibers, one for each emitter or channel in a segmented laser array 15. In FIG. 1, only one fiber 16 is shown for each segmented laser array 15A–15X but each such fiber is also representative of a group of such fibers to respective arrays 15A–15X, one for optically coupling each emitters $15_x$ of an array 15 to beam combiner 17. In any case, the combined beam outputs of each array 15 are combined together in beam combiner 17 as a single beam output for input to fiber pump source 18.

The arrangement and the particular employment of segmented laser arrays 15 in system 10 provide for optimized reliability and power efficiency. In system 10, the weakest point in terms of longevity are semiconductor pump sources 15. If any one of the arrays 15A, 15B, 15C, . . . should fail, the total primary pump power supplied to the corresponding amplifier 18 would accordingly be reduced, affecting the overall obtainable power level at output 11 of system 10. As is known in the art, the use of multiple lasers or laser arrays at lower operating power will increase reliability as exemplified in U.S. Pat. No. 5,287,216. The use of multiple lasers decreases the power requirements of each laser while increasing the reliability of the fiber pump source without compromising the gain of the source. However, the reliability and long term operation of system 10 of this invention is further enhanced in reliability over the conventional art. Segmented laser arrays 15 of the type disclosed in FIG. 4, to be discussed later, are constructed and operated so that there are multiple levels of long term reliability provided to system 10. First, segmented laser arrays 15 are constructed to provided continued reliability should one or more of the segmented laser emitters or channels in the array fail. The remaining segmented laser array emitters are designed to remain operative and continue to contribute power to the total power level required for pumping fiber pump source 18. If the laser diode arrays 15 are properly segmented into arrays of single mode laser emitters having both optical and electrical isolation from adjacent emitters, catastrophic failure of one or more segmented laser emitters will not propagate laterally into an adjacent segmented laser emitters to extend the damage into adjacent lasing elements. Examples of such failure are lateral propagation of dark line defects, blisters or facet defects or damage to a neighboring element affecting overall reliability of the entire segmented laser array. The lateral propagation of these failures is due to light separation and current pumping of the respective emitters. We have shown that facet damage occurring to one segmented laser element does not effect an adjacent segment laser element so that, on a fundamental level, the segmented laser array reliability can be evaluated as though power were being provided by independent, monolithic single mode laser sources, although these sources are monolithically presented on a single chip. Also, multiple redundancy in the number of segmented laser arrays 15 provides for reliability and further allows for redundant power supply options in that groups of segmented laser arrays may be driven in series by a plurality of single power sources so that, in the extreme, there may be one power supply provided for each segmented laser array.

Second, the segmented laser arrays 15 are operated below their rated power levels so that if (1) one or more segmented laser elements in an array 15 should fail, the total power output of the particular segmented laser array can be increased to compensate for the power loss due to the failed elements in the array without exceeding the rated power level of the partially failed segmented laser array, and (2) if one or more of the segmented laser arrays 15 fails, then the total power output of the remaining segmented laser arrays may be individually increased to compensate for the power loss due to the failed segmented laser array still without possibly exceeding the rated power level of any respective segmented laser array.

Third, a plurality of high power fiber pump sources are provided for pumping a plurality of injection signal fiber amplifiers. If one of fiber pump sources should fail, increased pumping power is available from the remaining fiber pump sources via their respective single mode amplifiers.

As a specific example of optical amplifier pumping system 10, single Er:Yb stage fiber amplifiers 19 provide a 1 W saturated power output and can provide at least a 50% optical-to-optical efficiency. Taking into consideration coupling losses between stages, approximately four amplifier stages are able to reach a total power output at output 11 of 3 W at a wavelength of 1.55 $\mu$m so that the individual amplifiers 19 need to be pumped with 2 W of power at a wavelength of around 1.06 $\mu$m. We have found that the optical-to-optical efficiency of an Nd doped double clad fiber 18 is about 40% when operated in a narrow wavelength range at around 1.06 $\mu$m. Therefore, each fiber pump source 18 requires a total of 5 W from primary pump source 15 operating at around a 808 nm wavelength matched to the absorption bandwidth of the Nd doped fiber pump source 18. For a Yb doped fiber pump source 18, a primary semiconductor pump source 15 would be at around a 915 nm wavelength matched to the absorption bandwidth of the Yb doped fiber pump source 18. This required primary pump power of 5 W can be provided by the plurality of segmented laser arrays 15 shown in FIG. 4.

The output via fibers 16 of segmented laser arrays 15A, 15B, 15C, . . . are tightly bundled or fused together, as will be discussed in greater detail later, and re-imaged via beam combiner 17 to substantially match the dimensions and the numerical aperture of the inner cladding of the double clad fiber of source 18. Fiber pump sources 18 include an input reflector with a high reflectance at 1.06 $\mu$m and high transmission at the 808 nm pump wavelength. The output of fiber pump sources 18 may be spliced to fiber amplifiers 19, as previously indicated. The output of each of the fiber pump sources 18 may have a reflector, such as a mirror (not shown) formed or positioned at the output end of fiber pump source 18 or a fiber grating 18A may be formed adjacent to their output ends for reflective feedback at $\lambda_p$=1.06 $\mu$m (e.g., with feedback reflectivity in the range of 3% to 10%) to force fiber pump sources 18 to maintain operation at, for example, around 1.06 $\mu$m in order to optimize the absorption of the pump power in Er:Yb the rare-earth doped amplifiers 19.

Reliability of the overall pump source configuration of FIG. 1 is significantly further increased by operating segmented laser arrays 15 under their rated power levels together with providing a large number of additional segmented laser arrays to meet the 5 W demand level for input power to fiber pump source 18. For system 10 in the case here requiring a 3 W output 11 at $\lambda_s$ equal to 1.55 $\mu$m, approximately fourteen individual segmented array sources 15, having eight individual laser elements on 13 $\mu$m centers, all operating at about 808 nm, ±3 nm, with a derated output power of 360 mW, would be required to provide a total semiconductor pump power of 5 W for a single fiber pump source 18. The fourteen laser arrays 15 may be serially powered by one, two or more commercially available power supplies, up to fourteen individual power supplies with one supply for each array. Each fiber pump source 18 would then provide pump power of 2 W at 1.06 $\mu$m.

The output of an array 15 may be optically coupled to a 100 $\mu$m diameter multimode fiber having a numerical aperture of 0.12 and coupled via beam combiner 17 to the inner cladding of double clad fiber pump source 18. The pump double clad fiber may, for example, be of the type shown in FIG. 9 having a rectangular shaped inner cladding, for example, a cross-sectional dimension of 130 $\mu$m by 360 $\mu$m, and, further provided with an input reflector, e.g., a formed Bragg grating 18B in the fiber, with high reflectance at the 1.06 $\mu$m wavelength of the fiber pump source and high transmission at the primary pump wavelength of 808 nm. The coupling optics comprising beam combiner 17 to multimode fiber pump source 18 may be comprised of an input array of fibers matched to the fibers from the fiber coupled segmented laser arrays 15 and output optics matching the 130 $\mu$m by 360 $\mu$m input of the inner cladding of fiber pump sources 18. As a specific example, beam combiner 17 may comprise approximately twenty-one fibers placed in a close packed arrangement of 3 by 5 fibers. The outer dimension of a 100 $\mu$m core fiber is 140 $\mu$m so that in the 3 by 5 fiber arrangement, a total output aperture would be 420 $\mu$m by 980 $\mu$m having a numerical aperture of 0.12. The combined output power of the fourteen segmented laser arrays 15 provided from this aperture is optically coupled to the 130 $\mu$m by 360 $\mu$m double clad fiber inner cladding through coupling optics that de-magnify this input source by a factor of about 3.5 to an image size of 120 $\mu$m by 280 $\mu$m. The demagnification of the input increases the numerical aperture of the pump input beam to about 0.42; however, this numerical aperture is still less than the numerical aperture of the double clad fiber of fiber pump source 18.

Based upon the architecture of system 10, we have determined that it is possible to optically couple at least thirty-six 808 nm semiconductor pump array sources 15A, 15B, 15C, . . . to a Nd doped double clad fiber pump source 18 while achieving the associated improvements in reliability as set forth above.

The plurality of fiber coupled, segmented laser arrays 15A, 15B, 15C, . . . would ordinarily be mounted on a water cooled heat sink for heat dissipation. However, no temperature control of the individual segmented laser arrays 15 such as by means of the use of thermo-electric coolers is necessary for wavelength adjustment due to operational temperature changes because the wavelength acceptance bandwidth of the Nd doped double clad fiber pump sources 18 of 30 nm allows for a abroad range of operating temperature without the need for such thermo-electric coolers. By increasing the length of the Nd fiber, the pump wavelength range for efficient operation may be increased. Moreover, the larger the separation between emitters of arrays 15 permits for passive cooling because of the larger area for thermal dissipation.

The process of determining the final particular design of system 10 is an iterative one in that it is dependent on the ultimate power output desired from the system and the number of amplifier stages 19 and power per amplifier stage as well as the required power per fiber pump source 18 to achieve the output power goals of the entire system 10.

In summary, there are two principal levels of redundancy in the fiber pump source. First, there is employment of a plurality of laser diode pump array sources 15 of substantially equivalent wavelength. Two additional aspects of this redundancy is (1) the operation of the plurality of segmented laser arrays below their rated power levels, which is possible due to the number present, and (2) the option of redundant power supplies, explained in greater detail later, whereby groups of segmented laser arrays 15 may be driven by many power supplies up to the extreme of one power supply to drive each segmented laser array. Second, the laser diode array sources are provided with means to prevent or otherwise mitigate lateral dark line defect propagation and other failure mechanisms in the emitters in each of the array sources. The defect propagation is caused by both light generation and current pumping of the emitters. The proper segmentation and/or fusing of the monolithic emitters substantially eliminates cross failures between adjacent emitters due to lateral dark line defect propagation or due to lateral facet blister propagation into an adjacent emitter causing its ultimate failure.

Reference is now made to a statistical approach to determine the affects of employing the multiple level of redundancy of this invention. The assumptions utilized in this statistical approach are a full system 10 reliability requirement for random failure of mean-time-between-failures (MTBF) of 200 years or $1.8 \times 10^6$ hours through a 10 year period of operation. Also, failure of individual single mode emitters or channels are assumed statistically independent between emitters on a single or different laser diode chip. Under these assumptions, it is theorized that there is about a 5% system failure rate over a 10 year period.

In the example above, there are four solid state amplifiers 19 with four fiber pump sources 18 pumped by a plurality of fourteen segmented laser arrays 15 each having eight emitters and, therefore, a total of 122 emitters. The emitter power per emitter required is relatively low, e.g., 45 mW per emitter. A system MTBF of $1.8 \times 10^6$ hours requires a MTBF requirement of $7.2 \times 10^6$ hours for each of the four 1.06 $\mu$m, 2 W fiber pump sources 18. For an anticipated 40% 808 nm to 1.06 $\mu$m conversion efficiency of the fiber pump sources comprising Nd doped double clad fibers, this means that a greater than $7.2 \times 10^6$ hour MTBF requirement for the 5 W primary pump source of fourteen segmented laser arrays pumping each of the 1.06 $\mu$m double clad Nd fiber pump source 18. Based upon actual lifetime tests conducted and scaling factors, the single mode emitter MTBF reliability at room temperature operation per segment laser emitter is shown in Table I below:

TABLE I

| Segment Laser Single Emitter Power Level (mW) | MTBF (hrs.) |
|---|---|
| 150 | $1 \times 10^5$ |
| 75 | $5 \times 10^5$ |
| 50 | $1.3 \times 10^6$ |
| 30 | $2.5 \times 10^6$ |

Reference is now made to FIGS. 2, 3 and 4 relating to the integrity of semiconductor laser sources employed as a primary laser pump source and their utility, longevity and reliability in pumping of fiber pump sources 18 of the type employed in system 10. As previously indicated, the reliability of fiber pump sources 18, albeit a fiber laser or a fiber amplifier, is basically determined by the life expectancy of semiconductor laser sources employed to pump sources 18. High reliability of these semiconductor pump sources can be achieved not only by increasing the number of laser emitters coupled into the fiber pump source 18, but also by increasing the reliability of the individual pump laser sources per se. It should be understood that in comparing the reliability of different pump laser diode sources, the brightness to be obtain from the combined sources must be taken into consideration because laser diode sources that have low brightness limitations will limit the number that be efficiently coupled into a double clad fiber pump source which also is a limit on semiconductor pump source redundancy.

FIG. 2 discloses a broad area laser diode source 13A, e.g., a Model SDL No. 2360-N2 commercially available from SDL, Inc. in San Jose, Calif., may provide a 100 $\mu$m output from broad stripe $13_{BS}$ at a rated power output of 600 mW. Device 13A is shown with its output beam 22 collimated by lens 20. This device is quite useful as a primary pump source for fiber pump sources 18 because of its large power output for pumping purposes, but is possibly limited from long term reliability for applications contemplated herein because the development of a defect 13F anywhere within the active region of the device will result in complete failure of source 13A. Thus, one local defect 13F in stripe region $13_{BS}$ of the laser active region means complete device failure. This problem can basically be avoided by employing a plurality of multi-array laser source 13B shown in FIG. 3, also called a laser bar. The multiple emitters together provide sufficient output power to provide primary pumping for fiber pump sources 18. Such an arrangement is exemplified in U.S. Pat. No. 5,185,758 (incorporated herein by reference thereto) utilizing three 500 mW laser diode arrays, Model SDL No. 2430 commercially available from SDL, Inc. in San Jose, Calif. These laser arrays have a plurality of emitters or channels $13_1, 13_2, 13_3 \ldots 13_x$, comprising ten emitters with 10 $\mu$m center-to-center spacing with emitter stripes of 6 $\mu$m widths. The advantage of these arrays is that any developed defects in any one of the emitter stripes or regions $13_x$ rendering that emitter inoperative does not necessarily mean failure of all of the other emitters $13_x$. As a result, the remaining emitters 13 remain in operation to continue to supply optical power. However, since the emitters are sufficiently close to one another to have overlapping optical coupling to some degree, although the degree may be very small, such as less than 1%, the lateral propagation of dark line defects in emitters that have failed or are doomed for failure into adjacent emitters may occur causing their subsequent failure. As previously indicated, this lateral propagation occurs due to light generation in the defective emitter or is due to the pump current applied to the defective emitter or a combination of both. Thus, if neither of these phenomena existed (which is, of course is not possible in order to achieve the purpose of the emitter-light generation), lateral propagation of dark line defects would not normally occur. In the case of laser diode monolithic array 13B in FIG. 3, the spacing between emitters $13_1$–$13_x$ are maintained sufficiently close to retain a level of high brightness in the far field output which means that at least the evanescent field tails of adjacent optical fields of emitters $13_1$–$13_x$ will overlap to some extent as indicated at $13_{OV}$ in FIG. 3. Such a center-to-center spacing is approximately 10 μm or less for 3 μm to 6 μm wide stripes. Overlapping optical fields into adjacent emitters $13_1$–$13_x$ leads to the problem, indicated above, of the propagation of dark line defects internally of the device or propagation of blisters developed at the output facet which develop at one emitter will laterally propagate into a neighboring emitter resulting in its own failure as well as the failure of the neighboring emitters. Thus, the reliability is lower for the application of this type of laser diode array for long term usage in remote areas of application for fiber pumping system 10. This defect propagation is reduced to be substantially nonexistent by providing a segmented laser diode monolithic array 15 of FIG. 4, which is more reliable than the laser diode array 13B of FIG. 3 in terms of long term reliability and lifetime.

While optical field isolation can be achieved by segmenting the laser into many single mode emitters without any optical overlap, electrical field isolation can be achieved by employing electrical fuses for the individual emitters in the array. If the emitters are sufficiently spaced apart, a catastrophic failure in one emitter will not affect the performance of adjacent emitters because potentially propagating defects causing such failures will remain localized to a single emitter. Thus, if the number of emitters is sufficient and the power handing capability of the plural emitters is sufficient, the segmented laser array will be capable of within-rated power operation with one or more of its emitters dead.

Another manner of achieving isolation of emitters $15_x$ of laser arrays 15 is to provide material composition between the individual emitters that is of higher bandgap than the material of the emitters themselves. This can be accomplished in well known ways such as by means of buried heterostructure structure, a ridge waveguide structure, a channeled substrate waveguide structure, a mesa waveguide structure or an impurity induced disordered waveguide structure.

In the case of planar type active region laser array structures, emitter separation must be sufficient between emitters $13_x$ so that there is zero optical field overlap between adjacent emitters as illustrated in connection with laser array 15 in FIG. 4. It was previously thought that 10 μm spacing between emitters in a laser array was sufficient to localize damage to single emitter 13x with improved reliability appearing credible. However, we have discovered that with this center-to-center spacing, there still remains a sufficiently small amount optical field overlap, such as several percent or even below one percent, so that in order to eliminate the propagation of defect damage to neighboring emitters, there must complete separation of the optical fields of adjacent emitters with no occurrence of any significant optical field tail overlap, as illustrated in FIG. 4. We call this arrangement, "laser array emitter segmentation" forming a segmented laser array 15 having individual emitters $15_1$, $15_2$, $15_3$, . . . $15_x$ with substantially zero optical field overlap. An optimal center-to-center spacing between emitters $15_x$ is in the range of 13 μm to 18 μm, preferably in the range of about 13 μm to 15 μm center-to-center spacing for 3 μm to 6 μm wide stripes. Beam fill optics must be utilized to maintain sufficient brightness without affecting the reliability of segmented laser array 15, which may be accomplished by collimating the output from the individual emitters $15_x$ with a microlens array 21 on the same center-to-center spacing as emitters $15_1$, $15_2$, $15_3$, . . . $15_x$, producing collimated beams 23 which, with the other laser pump beams from other corresponding pump sources 15, are conditioned and focused to a diffraction limited spot into double clad fiber pump source 18. A more detailed view of a lens system for maintaining brightness is disclosed and discussed in connection with FIG. 14. Alternatively, as already indicated above in FIG. 1, the individual outputs of emitters $15_x$ may be fiber coupled via fibers 16 into beam combiner 17. By conditioning, a turning mirror array of the type disclosed in U.S. Pat. No. 5,168,401, assigned to the assignee herein and incorporated herein by reference thereto, is utilized for modifying the beam symmetry to improve light beam focusing dimensions in order to further conserve beam brightness for focusing via a focusing lens system to an improved diffraction limited spot size. Optionally, a lens arrangement in front of any array source 15 may comprise a laterally disposed cylinder lens (for collimating the light beams in the lateral direction and is optional) followed by (1) beam fill optics, such as microlens array 21 and an appropriate focusing lens system or (2) beam fill optics followed by a turning mirror array disclosed in U.S. Pat. No. 5,168,401 and an appropriate focusing lens system, or (3) turning mirror array disclosed in U.S. Pat. No. 5,168,401 followed by beam fill optics and an appropriate focusing lens system. The focusing lens system may be comprised of spherical lens as is known in the art.

An additional advantage of segmented laser arrays 15 having comparatively highly separated emitters $15_x$ is the significant improvement in the resistance to feedback induced wavelength fluctuations due to the substantial optical isolation of adjacent emitters. Any sporadic reflected light feedback in the forward optical system and coupling interfaces from emitters that may be operating at different wavelengths will return at reflected angles exceeding angles required for direct feedback into adjacent emitters. As a result, the possibility of noise feedback from emitters into adjacent emitters is substantially less possible due to the greater emitter separation.

The number of emitters or channels $15_x$ that can be placed upon a single chip 15 is limited by overall thermal considerations, such as adequate heat sinking for increased heat generating capacity as well as consideration in an increase in chip mechanical stress when bonded to heat sink due to differences in thermal coefficients of expansion between these two components. Also, for cost considerations in a system, such as system 10, it is advantageous to employ a large number emitters per chip to provide additional associated high power from such a larger number of single chip emitters optically coupled to a fiber pump source. A compromise between seeking optimized reliability balanced with these costs leads to adopting a segmented laser array 15 having emitters $15_x$ numbering in the range of about 15 to 20 emitters.

It should be noted that further improvements in brightness with beam-fill optics and without affecting reliability can be achieved by placing emitters closer together, such as below 13 μm center-to-center spacing with barriers formed between adjacent emitters to eliminate optical field overlap between adjacent emitters as well as provide for greater optical confinement of the propagating radiation formed within the individual emitters. Such barriers are known in the art and include buried heterostructure laser arrays, ridge waveguide laser arrays, index guiding ridge laser arrays, index guided laser arrays formed by impurity induced disordering, or mesa or grooves formed between the emitters to isolate dark lines from propagating between laser emitters. In such cases, obviously the emitters may be more closely spaced. However, such index guided arrays cost more to manufacture than planar gain guided monolithic arrays of the type shown in FIGS. 3 and 4.

Emitters $15_x$ can be either single mode or multimode dependent upon stripe width, but single mode emitters are preferred because they provide clean Gaussian far field patterns for focus into double clad fiber pump sources 18. However, multimode channels offer broader spectral behavior and larger flux densities desired for solid state pumping applications, such as rod or YAG lasers.

Relative to electrical field isolation, reference is made to FIG. 5. A single laser array driver 24 supplies pumping current through a plurality of electrical leads or bonding wires 27 to individually addressable laser emitters $15_1$, $15_2$, $15_3$, ... $15_x$. The use of individually addressed emitters will require individual drive circuits for each emitter $15_x$. A single driver 24, however, can be employed by fusing the electrical connection to each individual emitter. Such fusing can be implemented in leads 27 in the form of individual fuse devices 28 or, alternatively, fusing may be on the array chip 15 itself. The electrical contact pattern of array 15 is modified so that individually addressable contacts 15' are formed so that an electrical short of one emitter of array 15 will not cause a short of the entire multi-emitter array via a single addressing contact for all emitters of the array.

Fuse device 28 is a low temperature meal strip of small cross-section that will melt when an electrical short causes the drive current supplied to a now electrically shorted out emitter $15_x$ to rise to several times its normal drive current causing the fuse to blow or open cutting off current to the electrically shorted emitter. Also, with no current present as well as lack of light generation, there is no further dark line defect propagation, and its effects are altogether eliminated.

A fuse on chip 15 may be formed by choosing a suitably small cross-sectional area in the metalization line for each emitter stripe that would melt when emitter failure in the form of an electrical short causes the current through the emitter to rise to several times the normal drive current. The fuse region is of lower melting point metal compared to the emitter contact metalization. The metalization fuse region would preferably be covered with an insulative coating material, such as $SiO_2$ or $Si_3N_4$, provided during chip fabrication photolithography or added after chip and fuse metalization formation. The insulative covering material would prevent debris developed from the fusing action via high current flow through one or more defective emitters of array 15 to damage or electrically short out other emitters $15_x$ of the array.

Reference is now made to FIGS. 6 and 7 illustrating in more detail the optical coupling of segmented laser arrays 15 into a double clad fiber having a particular inner cladding configuration. Segmented laser arrays 15A, 15B, 15C,, ... 15X are individually of the type shown in FIG. 4, and have their outputs optically coupled into a bundle of fibers $16_1$, $16_2$, $16_3$, ... $16_x$ via couplers $25_1$, $25_2$, $25_3$, ... $25_x$, such as microlenses 21 of FIG. 4, to provide a collimated beam which is focused into the apertures of respective fibers 16 by means of a focusing lens system of the type previously indicated. Alternatively, fibers $16_1$, $16_2$, $16_3$, ... $16_x$ may be directly coupled to their respective segmented laser arrays 15 as illustrated in FIGS. 12 or 13, to be described later. The combined output of bundled fibers $16_1$, $16_2$, $16_3$, ... $16_x$ is provided as a collected output via beam combiner 17 which is focused through lens 26 into inner cladding 31 of double clad fiber pump source 18. Double clad fiber 18 comprises a typical cylindrical core 30 of refractive index, $n_1$, with a surrounding inner cladding 31 of either circular or elliptical configuration of refractive index, $n_2$, as illustrated in FIG. 7. Inner cladding 31 is surrounded by an outer cladding 32 having a refractive index, $n_3$, where $n_1 > n_2 > n_3$. The outer surface 31A of inner cladding 31 may also be roughened so that propagating modes in inner cladding 31 are scattered at multiple, different angles to enhance the absorption of pump radiation via the rare-earth atoms in the inner cladding material. Double clad fiber 18 functions as a pump fiber laser with one end of its optical cavity designated at grating 18C. Fiber 18 may also have grating 18B for optical feedback to segmented laser arrays 15A, 15B, 15C,, ... 15X for wavelength stabilization. Alternatively, mirror 18A, deposited on the end of fiber 18 as known in the art, may be used to provide optical feedback for fiber laser 18 and may also be designed to provide for optical feedback to segmented laser arrays 15A, 15B, 15C,, ... 15X to provide wavelength stabilization. As an example, core grating 18C may provide high reflectivity for light at fiber laser absorption wavelength of 1.06 $\mu$m and of high transitivity for the diode pump wavelength of 915 nm (Yb) or 808 nm (Nd) whereas inner cladding grating 18B provides a partial, narrow band reflector, e.g., 5% to 20% reflection, of the diode pump wavelength of 915 nm or 808 nm for stabilization of this wavelength in the emitters of segmented laser arrays 15A, 15B, 15C,, ... 15X. In the case of mirror 18A, the deposited layers comprising the mirror coating are designed to provide forward reflection at the pump absorption wavelength of 1.06 $\mu$m and rearward reflection to the stabilized the wave-length operation of segmented laser arrays 15A, 15B, 15C,, ... 15X at a wavelength around either 915 nm or 808 nm. This same structure is true for the embodiments shown in FIGS. 12–14 discussed below.

Reference is now made to FIG. 8 which illustrates a power supply scheme of enhanced reliability in the operation of system 10 shown in FIG. 1. In FIG. 8, only one fiber pump source 18 is illustrated in its entirety. Supply system 40 comprises four electrical power supply sources 41, i.e., sources $PS_1$, $PS_2$, $PS_3$, and $PS_4$. The four power supply sources 41 provide electrical pumping power to groups of three serially connected segmented laser arrays 15 in groups such that power supply source $PS_1$ supplies power to arrays 15A, 15B and 15C; power supply source $PS_2$ supplies power to arrays 15D, 15E and 15F; power supply source $PS_3$ supplies power to arrays 15G, 15H and 15I; and power supply source $PS_4$ supplies power to arrays 15J, 15K and 15L. Due to the large number of segmented laser arrays 15A–15L (twelve in this example), it is possible to operate each of them below their rated power level, as previously indicated. For example, if the power output rating of each array 15 is 700 mW, then the arrays 15A–15L may be individually operated at a lower power level, such as 500 mW to achieve, in total, via fiber pump source 18, the required pump output power of 2 W, as exemplified above.

Controller 44 provides electrical drive signals to each of the four power supplies 41 for driving their three serially connected segmented laser arrays 15. Controller 44 controls the level of power supplied by power supplies 41, in part, by means of a feedback circuit that monitors the total power level from all of the arrays 15A–15L. The individual outputs of segmented laser arrays 15A–15L are optically coupled, respectively, to fibers $16_1$–$16_{12}$ and are bundled and fused together providing beam combiner 17 for optical coupling into double clad fiber pump source 18. Fiber bundle fusing techniques are discussed later. Between fiber pump source 18 and beam combiner 17 is an optical diverter 41, e.g., a dichoric beam splitter, to deflect a small portion of the radiation from the output of beam combiner 17 which is directed to optical-to-electrical transducer 43. Transducer 43 provides an electrical signal proportional to the optical power of the radiation entering source 18. This feedback electrical signal is received by controller 44 which includes a comparator circuit for comparing this feedback signal with a reference signal representative of the driving signals necessary for the respective power supplies 41 to maintain the desired output level for fiber pump source 18, which will be recalled in the example above consists of 2 W. Thus, controller 44 monitors the total optical power output from all of the segmented laser arrays 15A–15L against a predetermined level. When there is a deviation from the predetermined level, controller 44 increases the drive signal value to one, several or all power supplies 41. As a result, the power output level from fiber pump source 18 is maintained at the desired output level and still within the rated output power level of the individual segmented laser arrays (700 mW in the example here). Moreover, the life of laser array sources 15 are extended since they are continually operated at a derated optical power level. If any one of the emitters $15_1$–$15_x$ of any one of the segmented laser arrays 15A–15L should fail, the optical power level of either the individual arrays where the failure appears, or the total optical output power of the entire array can be increased within optical power rating levels of arrays 15 to maintain the desired power level input to fiber pump source 18 by increasing the level of electrical drive signal to all, if not one or more, of the power supplies 41. In the same manner, where one or more of entire segmented arrays 15A–15L fails, either the optical power level of the remaining serially connected segmented laser arrays can be increased where a particular failed segmented array appears electrically shorted out, or the total optical output power of the entire array can be increased while still maintaining optical power rating levels of the plural individual laser arrays and maintaining the desired power level input to fiber pump source 18. The increase in optical power is accomplished by increasing the level of electrical drive signal to all, if not one or more, of the power supplies 41.

In addition to extending the life of the pump supply system 40 by means of the scheme illustrated in FIG. 8, a significant decrease in the level of optical output power from beam combiner 17 as monitored by transducer 43 is also an indication that at least one entire segmented laser array 15 has failed in part or whole. The feedback system of FIG. 8 can, therefore, also serve as a monitor as to when a plurality of emitters or one or more segmented laser arrays have failed indicating a need for future replacement or repair without requiring mediate shutdown of system 40. Other approaches may be utilized to determine diode failures, such as operating one power supply 41 at one time and measure output power at detector 43.

Another alternative feedback control is the employment of a controller to ultimately control the operating wavelength characteristics of the individual laser arrays and determine power level changes determinative of optical output level changes employing thermal sensing means for monitoring the array operating temperature, such as with a thermistor, and changing the operating temperature of the array through control of a TEC cooler, as is known in the art, to change either the wavelength or light output intensity. A controller may be utilized to detect changes in voltage and current values in driving the individual arrays which changes are caused by changes in the array operating characteristics such as changes in temperature operation due to failure or nonfunctional operation of one or more emitters in an array causing a change in voltage drop across and current flow characteristics through operating as well as failed emitters. Therefore, changes in power and resistance due to temperature changes are monitored by the controller which monitors these factors via input requirements of power of the laser diode array and input from the thermistor monitoring environmental temperature of the array. In addition to this, two photodetectors may be utilized at opposite facet outputs of the laser diode array, one measuring the total power output of the array, such as in a manner depicted in FIG. 8, and the other functioning as a wavelength filter, such as a YAG crystal filter, to monitor the desired wavelength through detection of that wavelength's minimum absorption value corresponding to the desired wavelength of operation and provide an input to the controller for changing the temperature of operation of the laser diode array via the TEC cooler in response to any deviation of wavelength from the desired wavelength of operation from the array.

Reference is now made to FIGS. 9 to 11 which relate to a second embodiment comprising pump system 50, taking advantage of the use of redundant laser pump sources permitting substantial extended lifetime and accompanying longer reliability for the entire system. In FIG. 9, a plurality of segmented laser arrays 15A, 15B, 15C, ... are optically coupled via fibers $16_1$, $16_2$, $16_3$, ... to beam combiner 17 to provide pump input power to double clad fiber pump source 18 comprising an inner core 52 of refractive index, nl, inner cladding 53 of rectangular cross section of refractive index, $n_2$, and outer cladding 54 of refractive index, $n_3$, where $n_1 > n_2 > n_3$. The rectangularly shaped aperture provided by inner cladding 53 fairly matches the bundling of fibers 16 in a similar rectangularly shaped cross sectional configuration via beam combiner 17 so that a high level brightness optical coupling is achieved between the ends of fibers 16 and inner cladding 53. The output of fiber pump source 18 is coupled via beam combiner 57 to single mode fiber amplifier 19 comprising a single core 56 with outer cladding 56 as shown in FIG. 11. An injection signal, $\lambda_s$, to be amplified is introduced via beam combiner 57 into fiber amplifier 19.

Double clad fiber pump source inner cladding 53 is doped with a rare-earth ions of either Nd or Yb. The wavelength and lasing operation of pump source 18 is maintained by means of Bragg grating 51 which has a periodic period designed to reflect back a small percentage of radiation at wavelength 1.06 $\mu$m. If Nd doping is used for source 18, segmented laser arrays are designed to operate at 808 nm whereas if Yb doping is used for source 18, segmented laser arrays are designed to operate at either 920 nm or 980 nm. It is an advantage to utilize Yb doped pump sources 18 at 920 nm because of their broad absorption bandwidth of over 20 nm. Fiber amplifier 19 has its core 55 co-doped with Er:Yb which permits pumping of the amplifier at a 1.06 $\mu$m and which has an absorption bandwidth that includes the operational wavelength band of Yb doped laser pump source 18.

As indicated above, the advantage of employing multiple pump sources 15 is that redundancy of these sources lend extended life of the total pumping system 50. Moreover, it is possible to use segmented laser arrays 15 operating at different wavelengths as long s the wavelengths from the laser arrays are within the absorption bandwidth of doped fiber laser pump source 18.

The concept of increasing the separation between emitters 15x of a segmented laser array 15 is not intuitive since such a separation can lead to a reduction in overall brightness so that such a primary pump source is not acceptable for the pumping application of this invention. Thus, attention must be given to improving optical coupling efficiency between the group of segmented laser arrays 15 and the inner cladding of fiber pump source 18 to produce a brightness-preserving optical pump system. In this connection, some further discussion of brightness preserving optics is useful.

When considering the case where a laser diode array bundle of fibers 16 is approximately circular and the pump cladding is also approximately circular, the etendue of the fiber bundle must be less than the etendue of the inner cladding input end of the double clad fiber pump source 18. The fiber bundle etendue is the product of the round end area, $A_1$, of the fiber bundle and the maximum light divergence from the fiber bundle, $\theta_1$, and the numerical aperture is $\sin \theta_1$. The double clad fiber etendue is the product of the round end area, $A_2$, of the inner cladding of the double clad fiber pump source 18 and the maximum acceptable light divergence of the inner cladding, $\theta_2$, and the numerical aperture is $\sin \theta_2$. Thus, effective coupling can be achieved if $A_1 \sin \theta_1 < A_2 \sin \theta_2$. Moreover, the brightness of the output is preserved when the product, $A \sin \theta$, in the case of both etendues remains constant. The typical optics system for preserving brightness, assuming an aberration-free system, is a conventional optical two lens system with the lenses spaced from each other by the sum of their focal points. The lenses are moved as a fixed assembly in order to accomplish fine focusing between the object and image plane with the magnification of the system remaining constant. Alternatively, an optical waveguide funnel 60, such as shown in FIG. 12, comprises beam combiner 17 having an input end 62 substantially matching the etendue of a fiber bundle 16 (FIG. 8) or of a segmented laser array 15. Output end 64 of optical funnel 60 is substantially matches the etendue of the input end of multimode fiber, pump source 18'. Multimode fiber, pump source 18' may include a mirror 18A of the type explained in connection with the embodiment shown in FIG. 6. Funnel 60 has a tapered core region that preserves brightness for propagating and mixing the radiation provided from segmented laser array 15, which is delivered from its output end 64 for optical coupling into double clad fiber pump source 18. Such a funnel 60 is similarly shown and described in U.S. Pat. Nos. 5,140,598 and U.S. Reissue Pat. 33,722, both to Scifres et al., which are assigned to the assignee herein and are incorporated herein by reference thereto. As the fiber taper diameter of funnel 60 decreases, the divergence in the fiber increases. As long as this divergence does not exceed the numerical aperture of fiber funnel 60, the light will be continually guided within the confines of optical funnel 60.

Another approach for high brightness efficient coupling is that the output of individual emitters $15_1$–$15_x$ of segmented laser array 15 are individually coupled into respective fibers $16_1$–$16_x$, as shown previously in FIG. 6. The forward ends of fibers 16 are bundled together and then fused together by means of melting the fiber ends into a homogenous mass or fused end portion 66 in a manner as taught in the above mentions Scifres et al. patents, particularly relative to FIG. 4 and FIGS. 12–15 in each of those patents. However, as not disclosed in those patents, the claddings of the respective fibers to be bundled may be stripped away and the fiber cores may be fused together in a manner to form an area of fused but individual fiber cores into a round configuration which is equal to the sum of the area of the bundled cores. The light divergence does not increase as the propagating radiation makes the transition from individual fiber cores into the fused fiber cores. Therefore, the brightness of the individually coupled laser emitters $15_1$–$15_x$ will be optimally preserved resulting in fused bundle core end having the maximum brightness that can be possibly obtained. This approach will allow the maximum number of individual fibers $16_1$–$16_x$ to be coupled into a predetermined diameter of the pump cladding of the fiber pump source 18. If the diameter of fused bundle end portion is within the diameter of the inner cladding of fiber pump source 18, fused bundle end portion may be directly spliced to the end of the double clad fiber source 18.

Another improved approach for optimized optical coupling is shown in FIG. 13 and comprises single core fibers 16 having a cladding glass material, such phosphate glasses, that have a lower melting temperature than the glass composition of the fiber cores comprising silica. As a result, when the forward ends of the fibers 16 are bundled and fused together, the fusing temperature applied is the melting temperature of the lower temperature cladding glass. The cladding glass material 65 will melt leaving the fiber cores 67 basically intact. During the molten state of the fiber ends, the fiber bundle is simultaneously squeezed tightly to cause the molten cladding material 65 to squeeze out from around their respective fiber cores 67 so that the fiber cores 67 are all brought into engagement with one another as shown in FIG. 13. This provides for tightest possible packing as well as the smallest fiber bundle end area while sufficiently bonding the fiber cores 67 together with highly transparent glass material of molten cladding 65, which material is less susceptible to absorption of external light. The cores 65 are not required to be physically melted together. As an example, a 19-fiber bundle comprising a plurality of fibers 14 having a 100 μm diameter core 67 and a 120 μm diameter cladding 65 will have an effective bundled diameter reduced from 580 μm to 500 μm upon cladding melt and squeezed flow around the cores 65, which represents about a 26% reduction in total area.

The splice 68 is conventionally difficult to carry out but is much more easily accomplished when the fiber bundle 66 is fused together employing the low temperature cladding material, mentioned above, so that some integrity of the fiber cores 67 is maintained such that they are fused together upon melting of their claddings 65 which is forced out from between the cores before the molten glass mass becomes solidified.

Laser fiber 18 includes fiber Bragg gratings 18B and 18C functioning in a manner as discussed in connection with the embodiment shown in FIG. 6.

Reference is now made to FIG. 14 which discloses a lens system for maintaining full brightness of the light collected from emitters $15_x$ of laser array 15. Since the plurality of emitters $15_1$–$15_x$ are separated by a spacer region which substantially prevents light from each emitter from interacting with light from adjacent emitters, it is important to retain as much of the brightness of the output from the array as possible. This is accomplished by means of cylinder lens 70 which collimates the light from array in the vertical or transverse direction (i.e., out of the plan of FIG. 14), followed by microlens array 72 having individual lenslets 73, one for each emitter $15_1$–$15_x$, which collimates the light in the lateral direction as depicted in FIG. 14. The orthogonally collimated light is then focused by spherical lens 74 into double clad laser fiber 18. Laser fiber 18 includes fiber Bragg gratings 18B and 18C functioning in a manner as discussed in connection with the embodiment shown in FIG. 6.

FIG. 15 discloses a manner and method of coupling light emitted from single fiber-coupled laser diode or multiple fiber-coupled laser diodes or emitters $15_1$–$15_x$ to a double clad fiber 18. Present commercially available fiber coupled high power laser diodes and arrays suitable for high reliability operation are provided with an optically coupled output fiber with a 50 μm to 200 μm diameter and an output power of 0.5 W to 2 W. The numerical aperture (NA) from the output end of each fiber varies between 0.4 and 0.1 depending on the package design of the laser array and fibers and their coupling. Lower NA packages are preferred since this leads to a higher brightness output from multimode fibers $16_x$. Double clad fiber 18 typically has a high NA of greater than 0.4 to maximize the angle over which light may be coupled into the fiber. In FIG. 15, output from a single or array 15 of fiber coupled emitters $15_1$–$15_x$ are fused together at 66 and also fused to fiber taper 80 at 88. Fiber taper 80 has a core 84 surrounded by a cladding 82 and has a refractive index matching that of the fibers. The input of fiber taper 80 matches the size of output array 66. The output of fiber taper 80 matches the NA of double clad fiber 18. For an input NA of 0.1 of laser array 15 and a 0.4 NA for double clad fiber 18, the input/output ratio of the diameter of fiber taper is approximately 4:1. The output of taper 80 is fused or spliced to the input end of fiber 18 at 89. A high reflection grating 90, such as 89% or more feedback, is written into fiber core 30 to provide for high reflectance at a wavelength around 1.09 μm. As an alternative, the fused section 66 of fibers $16_x$ may be formed as a taper to correspond with the 4:1 ratio taper of fiber taper 80 with its forward end spliced directly to double clad fiber 18.

Reference is now made to FIG. 16 which discloses another lens system for maintaining full brightness of the light collected from emitters $15_x$ of laser array 15. Beam fill optics must be utilized to maintain sufficient brightness without affecting the reliability of segmented laser array 15, which may be accomplished by collimating the output from the individual emitters $15_x$ with a microlens array 21 on the same center-to-center spacing as emitters $15_1$, $15_2$, $15_3$, . . . $15_x$, producing collimated beams 23. The collimated light 23 is then focused by spherical lens 100 to focus light beams 102 into double clad laser fiber 18. Laser fiber 18 includes fiber Bragg gratings 18B and 18C functioning in a manner as discussed in connection with the embodiment shown in FIG. 6. For improvement of the focusing capability to a diffraction limited spot, the beam transformation lens system, as disclosed in U.S. Pat. No. 5,168,401 incorporated herein by reference, or the optical beam reconfiguring devise and handling system for its utilization, as disclosed in U.S. patent application Ser. No. 08/614,787, filed Mar. 8, 1996 which is incorporated herein by reference thereto, may be incorporated into the lens system of FIG. 16, in particular between microlens array 21 and lens 100 as taught therein.

Although the invention has been described in conjunction with one or more preferred embodiments, it will be apparent to those skilled in the art that other alternatives, variations and modifications will be apparent in light of the foregoing description as being within the spirit and scope of the invention. Thus, the invention described herein is intended to embrace all such alternatives, variations and modifications that are within the spirit and scope of the following claims.

What is claimed is:

1. A pumping system comprising:
   a gain medium;
   at least one semiconductor laser array formed on a single substrate for optically pumping said gain medium and having a plurality of integrated, laterally spaced emitters, said emitters subjected to lateral propagation of defects exiting in one or more of said emitters into adjacent emitters causing its cessation whereby said laser array is prematurely rendered defective; and
   isolation formed between adjacent emitters for rendering ineffective said lateral defect propagation upon adjacent emitters from adjacent emitters such that if any one or more emitters of the array cease to operate due to defect degradation, the adjacent emitters thereto in said array will continue to operate unaffected by such cessation.

2. The pumping system of claim 1 wherein said isolation comprises a spatial region sufficiently large between adjacent emitters such that said lateral defect propagation from a degraded emitter to an adjacent emitter is substantially mitigated under continuous normal operating conditions of said semiconductor laser array.

3. The pumping system of claim 1 wherein said isolation comprises a spatial region between said emitters of higher bandgap material such that said lateral defect propagation from a degraded emitter to an adjacent emitter is substantially mitigated under continuous normal operating conditions of said semiconductor laser array.

4. The pumping system of claim 1 wherein said isolation comprises a spatial region between said emitters of sufficient magnitude and of higher bandgap material such that defect propagation from a degraded emitter to an adjacent emitter is substantially mitigated under continuous normal operating conditions of said semiconductor laser array.

5. The pumping system of claim 1 wherein said isolation comprises regions between adjacent emitters that are formed to be substantially unpumped and optically inactive.

6. The pumping system of claim 5 wherein said regions are between 13 μm and 20 μm in width.

7. The pumping system of claim 5 wherein said regions have a width that is no more than twice the width of pumped regions for said emitters.

8. The pumping system of claim 1 wherein each emitter is individually electrically contacted.

9. The pumping system of claim 8 wherein a drive current is supplied to each of said individually contacted emitters and is fused to form an open circuit when its corresponding emitter is electrically shorted.

10. The pumping system of claim 1 wherein each of said emitters substantially operates in a single transverse mode for reducing noise feedback into said segmented semiconductor laser array.

11. The pumping system of claim 10 wherein said isolation comprises regions between adjacent emitters, said regions are between 13 μm and 20 μm in width.

12. The pumping system of claim 10 wherein said isolation comprises regions between adjacent emitters, said regions have a width that is no more than twice the width of pumped regions for said emitters.

13. The pumping system of claim 1 wherein said emitters are index guided lasers.

14. The pumping system of claim 13 wherein said index guided lasers comprise a buried heterostructure laser, a ridge waveguide laser, a channeled substrate waveguide laser, a mesa waveguide laser or an impurity induced disordered waveguide laser.

15. The pumping system of claim 1 wherein said gain medium is a double clad fiber doped with rare-earth species.

16. The pumping system of claim 15 wherein said amplifier medium is a fiber laser.

17. The pumping system of claim 1 wherein there are a plurality of semiconductor laser arrays each having a plurality of emitters with said isolation between adjacent emitters for preventing light from each emitter from interacting substantially with light from adjacent emitters.

18. The pumping system of claim 17 wherein said gain medium is a double clad fiber doped with rare-earth species.

19. The pumping system of claim 18 wherein said double clad fiber is a fiber laser.

20. A redundant, high power fiber amplifier system comprising:
a series of optically coupled fiber amplifier stages;
a plurality of fiber laser sources, at least one each coupled to the input of a respective fiber amplifier stage, said fiber laser sources comprising a double clad fiber having a core doped with an active element surrounded by an inner pump cladding;
a plurality of groups of laser diode pump sources spatially providing a plurality of outputs combined via an optical combiner, a group of said combined laser diode pump sources coupled to the inner cladding of each of said fiber laser sources;
characterized in that
said laser diode pump sources comprise a plurality of laser arrays in each of said groups each having a plurality of laser emitters, and isolation formed between adjacent emitters of each array for rendering ineffective lateral defect propagation upon adjacent emitters from adjacent emitters of the same array such that if any one or more emitters of the array cease to operate due to defect degradation, the adjacent emitters thereto will continue to operate unaffected by such cessation.

21. The redundant, high power fiber amplifier system of claim 20 further characterized in that said laser arrays are operated below their rated power levels so that if either (a) one or more emitters in an array should fail or (b) if one or more lasers arrays of one of said groups should fail, then the total power output power of remaining emitters of the laser array or laser array group is increased to compensate for the power loss due to said failure without exceeding the rated power level of said laser arrays.

22. The redundant, high power fiber amplifier system of claim 20 further characterized in that said plurality of fiber laser sources providing redundancy such that if one of said fiber laser sources fails, increase in power from remaining fiber laser sources may compensate for the power loss due to said failure without exceeding the rated power level of said fiber laser sources and their corresponding pump laser arrays.

23. The redundant, high power fiber amplifier system of claim 20 further comprising a plurality of power supplies for subgroups of said laser arrays in each of said groups so that if any one or more of said power supplies fails, then remaining power supplies from the same group may compensate for the power loss due to said failure without exceeding the rated power level of the fiber laser source and its corresponding pump laser arrays.

24. The redundant, high power fiber amplifier system of claim 23 wherein said laser arrays in a subgroup are coupled in series to its respective power supply.

25. The redundant, high power fiber amplifier system of claim 20 wherein said laser arrays comprise multimode sources, and outputs of each of said laser arrays coupled to said optical combiner via a multimode fiber.

26. The redundant, high power fiber amplifier system of claim 20 wherein each of said emitters in said laser arrays is independently connected to a power supply, a fuse device associated with each of said independently connected emitters so that an electrical short of any one emitter of said laser array will not cause a short of the entire laser array.

27. The redundant, high power fiber amplifier system of claim 26 wherein in said fuse device is formed either in a contact strip of said emitters or in a supply line connecting each of said emitters to a power supply.

28. A redundant, high power fiber amplifier system comprising:
a plurality of fiber amplifiers optically coupled in series to form a plurality of fiber amplifier stages;
an optical signal received as input to a first of said optically coupled fiber amplifiers having a wavelength within the gain band of said fiber amplifiers, said optical signal amplified by said fiber amplifiers and the amplified signal provided as output from a last of said optically coupled fiber amplifiers;
a plurality of fiber laser sources to provide optical pump input to said fiber amplifiers, at least one such pump input for each of said fiber amplifier stages and providing pump energy within the absorption bandwidth of said fiber amplifiers;
a plurality of semiconductor laser sources coupled respectively to each of said fiber laser sources to provide optical pump input to said fiber laser sources;
multiple redundancy provided in said system such that if at least one of said semiconductor laser sources fails, its corresponding fiber laser source will continue to operate under the power from the remaining coupled semiconductor laser sources, and if at least one of said fiber laser sources fails, the remaining fiber laser sources will continue to operate under increased power to replace the power lost from the failed fiber laser source.

29. The redundant, high power fiber amplifier system of claim 28 wherein said semiconductor laser sources coupled respectively to a fiber laser sources are of different wavelengths and are WDM combined for input to its respective fiber laser source.

30. The redundant, high power fiber amplifier system of claim 28 wherein said semiconductor laser sources coupled respectively to each of said fiber laser sources are at least one semiconductor laser array; and
isolation formed between adjacent emitters for rendering ineffective said lateral defect propagation upon adjacent emitters from adjacent emitters such that if any one or more emitters of the array cease to operate due to defect degradation, the adjacent emitters thereto in said array will continue to operate unaffected by such cessation.

31. The redundant, high power fiber amplifier system of claim 28 wherein said semiconductor laser sources are independently addressable via an electrical supply line from a power supply, and a fuse provided in said electrical supply line to form an open circuit when its corresponding laser source is electrically shorted.

32. The redundant, high power fiber amplifier system of claim 28 wherein said fiber laser sources are double clad fibers, the combined output from said semiconductor laser sources coupled into an inner cladding of its respective fiber laser source.

33. The redundant, high power fiber amplifier system of claim 32 wherein said double clad fibers have a core doped with a rare earth species.

34. The redundant, high power fiber amplifier system of claim 28 wherein said fiber amplifier stages are double clad fibers, the output from said fiber laser source coupled into an inner cladding of its respective fiber amplifier stage.

35. The redundant, high power fiber amplifier system of claim 34 wherein said double clad fibers have a core doped with a rare earth species.

* * * * *